(12) United States Patent
Stangl et al.

(10) Patent No.: US 8,395,043 B2
(45) Date of Patent: Mar. 12, 2013

(54) SOLAR CELL COMPRISING NEIGHBORING ELECTRICALLY INSULATING PASSIVATION REGIONS HAVING HIGH SURFACE CHARGES OF OPPOSING POLARITIES AND PRODUCTION METHOD

(75) Inventors: Rolf Stangl, Berlin (DE); Bernd Rech, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 0 days.

(21) Appl. No.: 13/375,557

(22) PCT Filed: Jun. 1, 2010

(86) PCT No.: PCT/DE2010/000625
§ 371 (c)(1),
(2), (4) Date: Dec. 1, 2011

(87) PCT Pub. No.: WO2010/139312
PCT Pub. Date: Dec. 9, 2010

(65) Prior Publication Data
US 2012/0073647 A1    Mar. 29, 2012

(30) Foreign Application Priority Data

Jun. 2, 2009 (DE) .......................... 10 2009 024 807

(51) Int. Cl.
*H01L 31/0224* (2006.01)
(52) U.S. Cl. ........ 136/256; 136/258; 136/261; 136/262; 136/264; 136/265; 438/98; 438/83; 438/93; 438/96; 438/57; 438/87; 438/85; 438/84
(58) Field of Classification Search .......... 136/243–265; 438/57–98
See application file for complete search history.

(56) References Cited

U.S. PATENT DOCUMENTS
(Continued)

FOREIGN PATENT DOCUMENTS

| DE | 3536299 A1 | 4/1987 |
|---|---|---|
| DE | 4412297 A1 | 10/1995 |

(Continued)

OTHER PUBLICATIONS

Jan Benick et al., "Surface passivation of boron diffused emitters for high efficiency solar cells", Proceedings PVSEC-33, San Diego, May 2008, p. 1-5.

(Continued)

*Primary Examiner* — Jennifer Michener
*Assistant Examiner* — Jayne Mershon
(74) *Attorney, Agent, or Firm* — Leydig, Voit & Mayer, Ltd.

(57) ABSTRACT

A solar cell includes a photoactive, semiconductive absorber layer configured to generate excess charge carriers of opposed polarity by light incident on a front of the absorber layer during operation. The absorber layer is configured to separate and move, via at least one electric field formed in the absorber layer, the photogenerated excess charge carriers of opposed polarity over a minimal effective diffusion length $L_{eff,min}$. The absorber layer has a thickness $L_x$ of $0 < L_x \leq L_{eff,min}$. First contact elements are configured to remove the excess charge carriers of a first polarity on a rear of the absorber layer. Second contact elements are configured remove the excess charge carriers of a second polarity on the rear of the absorber layer. At least one undoped, electrically insulating second passivation region is disposed in an alternating, neighboring arrangement with a first passivation region on the rear of the absorber layer.

20 Claims, 15 Drawing Sheets

U.S. PATENT DOCUMENTS

| | | | |
|---|---|---|---|
| 4,315,097 | A | 2/1982 | Solomon |
| 4,828,628 | A | 5/1989 | Hezel et al. |
| 4,886,555 | A | 12/1989 | Hackstein et al. |
| 5,356,488 | A | 10/1994 | Hezel |
| 2004/0187916 | A1 | 9/2004 | Hezel |

FOREIGN PATENT DOCUMENTS

| | | |
|---|---|---|
| DE | 19602313 A1 | 7/1997 |
| WO | 2007022955 A1 | 3/2007 |

OTHER PUBLICATIONS

Jan Schmidt et al., "Atomic-layer-deposited aluminium oxide for the surface passivation of high efficiency silicon solar cells", Proceedings PVSEC-33, San Diego, May 2008, p. 1-5.

European Patent Office, International Search Report in International Patent Application No. PCT/DE10/00625 (Dec. 9, 2010).

SOLAR CELL COMPRISING NEIGHBORING ELECTRICALLY INSULATING PASSIVATION REGIONS HAVING HIGH SURFACE CHARGES OF OPPOSING POLARITIES AND PRODUCTION METHOD

CROSS-REFERENCE TO PRIOR APPLICATIONS

This application is a U.S. National Phase application under 35 U.S.C. §371 of International Application No. PCT/DE2010/000625, filed on Jun. 1, 2010, and claims benefit to German Patent Application No. DE 10 2009 024 807.2, filed on Jun. 2, 2009. The International Application was published in German on Dec. 9, 2010 as WO 2010/139312 under PCT Article 21(2).

FIELD

The invention relates to a solar cell and to a method for the production of a solar cell.

BACKGROUND

A solar cell having a pn junction and two-sided contacting is described in DE 196 02 313 A1. The solar cell is equipped with an externally controllable field electrode to suppress the charge carrier recombination at the point of contact on the rear, which is turned away from the light. This field electrode is arranged between the contact fingers on an insulation layer on the absorber layer and is connected to an external voltage source. The field electrode at a negative potential generates an electric field in the semiconductor-insulator interface, which electric field forces the minority charge carriers diffusing into this region back towards the pn junction and, by contrast, accelerates the majority charge carriers towards rear-face contact. In order to reduce the recombination rate on the front of the solar cell, an externally controllable field electrode of opposed polarisation may also be provided there, the field effect of said field electrode forcing the majority charge carriers towards rear contact and forcing the minority charge carriers towards front contact. However, charge carrier separation takes place exclusively at the pn junction.

A solar cell contacted on the rear is described in WO 2007/022955 A1, in which the electric fields are produced for charge carrier separation in a doped absorber via alternately neighboring emitter regions (doped oppositely to the absorber) and BSF regions (highly doped identically to the absorber). However, the emitter and BSF regions are electrically conductive semiconductor regions with doping. Corresponding doping and structuring measures are necessary during production.

It is described in DE 44 12 297 A1 to passivate the recombination rate on the surface of a semiconductor element, for example p-conductive silicon, by applying a layer of an electric insulator, for example oxides or nitrides, to the surface of the semiconductor element, and then to apply electrical charges to the surface of the insulator layer. Positive or negative charges can be applied. The density of the charge carriers is thus reduced at the points of high density of states at trapping or recombination centres. An electric field is produced inside the semiconductor element by applying the charges, as a result of which electric field the freely movable minority charge carriers located in the conduction band (electrons with a p-doped semiconductor, holes in an n-doped semiconductor) are drawn from the near-surface region into the semiconductor element. The charges applied externally (for example by corona remove) may, for example, be fixed by a subsequently thermally grown cover layer. Insulation layers with charges may also be applied to both surfaces of the semiconductor element, but in this case charges of identical polarity are applied so as to measure the life span of the charge carriers.

The use of passivation layers made of aluminium oxide and silicon nitride with their different surface charges (AlO, negative, and SiN, positive) for solar cells to reduce the surface recombination rate is described in DE 35 36 299 A1. Solar cells with MIS contact over the entire surface, MIS inversion layer solar cells and solar cells with a conventional pn junction for charge carrier separation are described.

The application of $Al_2O_3$ as a passivation layer for a diffused (p+) emitter is also described in a publication by Jan Benick et al., "Surface passivation of boron diffused emitters for high efficiency solar cells" (Proceedings PVSEC-33, San Diego, May 2008). A solar cell $Al_2O_3$/cSi(p+, front emitter, planar, diffused)/c-Si(m, absorber, wafer)/$SiO_2$ with c-Si(n+, BSF, rear-face point contacts, diffused) was processed with an efficacy of 23.2%. The structure of a processed solar cell with 20.6% efficacy (silicon nitride/cSi(n+, front emitter, planar, diffused)/c-Si(p, absorber, wafer)/$Al_2O_3$ with c-Si(p+, BSF, rear point contacts, diffused) is described in a publication by Jan Schmidt et al., "Atomic-layer-deposited aluminium oxide for the surface passivation of high efficiency silicon solar cells" (Proceedings PVSEC-33, San Diego, May 2008). In both publications there are the (diffused) (p+) and (n+) emitters and BSF regions which (via the formation of a "conventional" p+/pn or n+/p emitter contact at the emitter-absorber interface or via the formation of a p-F/p or a n+/n BSF contact at the BSF-absorber interface) enable the selective "conventional" charge carrier separation.

The publication by Jan Schmidt et al. describes a solar cell of the generic type. It is a solar cell with a photoactive, semiconductive absorber layer, in which excess positive and negative charge carriers are generated by light incident on the front of the absorber layer during operation. In order to separate the positive and negative charge carriers, an electric field is generated in the absorber layer by the formation of a pn junction between the contact, over the entire surface, of a front emitter layer and a p-doped silicon wafer (see FIG. 3 of the publication by Jan Schmidt et al.). The separated charge carriers (minority charge carriers) can move over a minimal effective diffusion length $L_{\mathit{eff,min}}$ in the absorber layer before they recombine. Further, point contacts are provided as first contact elements on the rear of the absorber layer, which is turned away from the light during operation, in order to remove the positive charge carriers. To remove the negative charge carriers, contact strips are provided as second contact elements on the front of the absorber layer, which faces the light during operation. The solar cell is thus contacted on both sides. A planar $Al_2O_3$ layer is also located on the rear of the absorber layer as an electrically insulating first passivation region with a high negative surface charge for concentration of positive charge carriers in the absorber layer in the contact region. A planar silicon nitride layer is also located on the front of the solar cell on the emitter layer as an electrically insulating second passivation region with a high positive surface charge for concentration of negative charge carriers in the absorber layer in the contact region. However, in the solar cell the charge carrier separation takes place conventionally by means of a selective pn junction between the emitter and absorber.

SUMMARY

In an embodiment, the present invention provides a solar cell having a photoactive, semiconductive absorber layer configured to generate excess charge carriers of opposed polarity by light incident on a front of the absorber layer during operation. The absorber layer is configured to separate and move, via at least one electric field formed in the absorber layer, the photogenerated excess charge carriers of opposed polarity over a minimal effective diffusion length $L_{\mathit{eff,min}}$ in the absorber layer. The absorber layer has a thickness $L_x$ of $0<L_x \leq L_{\mathit{eff,min}}$. First contact elements are configured to remove the excess charge carriers of a first polarity on a rear of the absorber layer which faces away from the light incident during operation. Second contact elements are configured remove the excess charge carriers of a second polarity, opposite to the first polarity, on the rear of the absorber layer. A distance $L_y$ between a respective one of the first contact elements and a respective one of the second contact elements is $0<L_y \leq 2\, L_{\mathit{eff,min}}$. At least one undoped, electrically insulating first passivation region is disposed on the rear of the absorber layer. Each of the at least one first passivation region includes a first contact opening configured for connection of a respective one of the first contact elements and includes a first non-semiconductive material having a surface charge of the first polarity sufficient to cause a band bending of the absorber layer in a first direction until degeneration is at least substantially achieved. At least one undoped, electrically insulating second passivation region is disposed in an alternating, neighboring arrangement with the at least one first passivation region on the rear of the absorber layer. Each of the at least one second passivation region includes a second contact opening configured for connection of a respective one of the second contact elements and a second non-semiconductive material having a surface charge of the second polarity sufficient to cause a band bending of the absorber layer in a second direction opposite to the first direction until degeneration is at least substantially achieved.

BRIEF DESCRIPTION OF THE DRAWINGS

Exemplary embodiments of the solar cell according to the invention comprising passivation layers of opposed surface charge for field generation to separate excess charge carriers will be explained in greater detail hereinafter on the basis of the schematic figures (not drawn to scale) in order to understand the invention further. The invention is not limited to the exemplary embodiments. Other features and advantages of various embodiments of the present invention will become apparent by reading the following detailed description with reference to the attached drawings which illustrate the following.

DETAILED DESCRIPTION

Figure 1A:
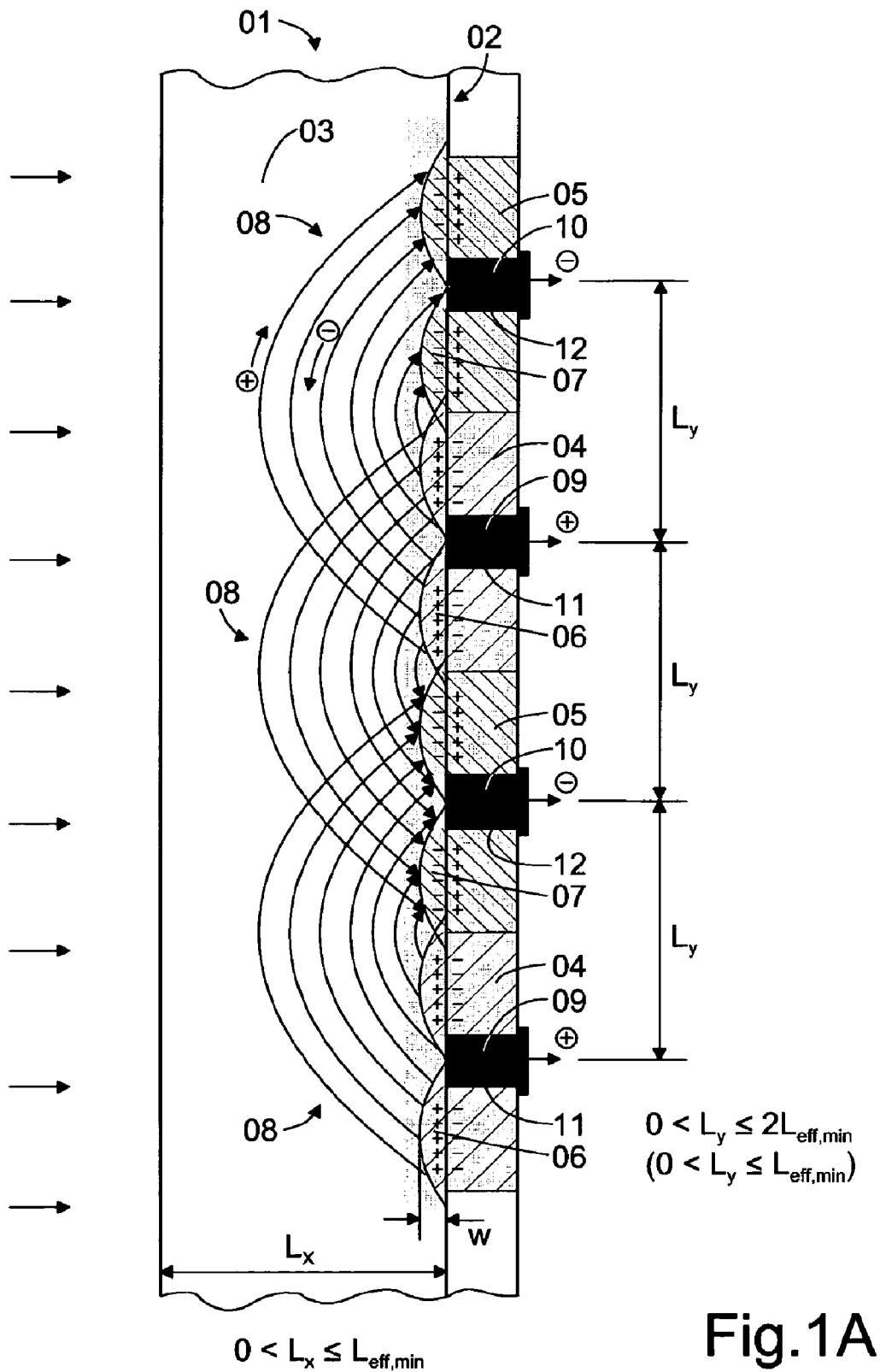
FIG. 1A is a principle view with schematically indicated electric fields in the semiconductive absorber layer which are generated by the two insulating passivation regions.

In an embodiment, the invention provides a solar cell including:
  a photoactive, semiconductive absorber layer which generates excess charge carriers of opposed polarity by light incident during operation on the front of the absorber layer,
  the formation of at least one electric field in the absorber layer, which field separates the photogenerated excess charge carriers of opposed polarity, which can move at least over a minimal effective diffusion length $L_{\mathit{eff,min}}$ in the absorber layer,
  first contact elements which remove the excess charge carriers of one polarity on the rear of the absorber layer, which is turned away from the light during operation,
  second contact elements which remove the excess charge carriers of opposed polarity, and
  at least one undoped, electrically insulating first passivation region which is applied to the rear of the absorber layer and is made of a first non-semiconductive material having a surface charge of one polarity which is so high that a band bending of the absorber layer is caused in one direction until degeneration is achieved or is almost achieved, and at least one undoped, electrically insulating second passivation region made of a second non-semiconductive material having surface charge of opposed polarity which is so high that a band bending of the absorber layer is caused in the opposite direction until degeneration is achieved or is almost achieved.

Photoactive component structures (for example photodiodes, solar cells) which are formed with the aid of semiconductors (for example silicon) generally use either a highly doped semiconductor-semiconductor junction (for example pn or pin structures) or a metal-semiconductor junction (Schottky contact) or a very thin metal-insulator (tunnel oxide)-semiconductor junction (MIS contact) for selective separation of the photogenerated excess charge carriers. In this case the electric field which is formed owing to the aforementioned junctions in the photoactive, semiconductive absorber layer is used to selectively separate photogenerated excess charge carriers. In particular, the electric field is always primarily produced via a conductive contact layer (emitter layer or metal layer or metal/tunnel oxide layer) which is positioned at least in localised areas on the photoabsorber (in the case of an MIS contact the tunnel oxide layer is considered to be an effectively conductive contact layer, in spite of the insulating nature of an oxide, since the tunnel oxide has to be processed so thinly that a significant current flow into the metal is possible owing to tunnel transport processes. All aforementioned junctions (pn junction, Schottky contact, MIS contact) thus specifically produce an electric field or a space-charge region on the photoabsorber which is then used to separate the photogenerated charge carriers.

If the objective is to achieve the most efficient collection of photogenerated excess charge carriers (for example the development of highly efficient solar cells, for example based on silicon wafers), then the highly doped semiconductor layers (in particular the emitter layer in pn structures) and the contact recombination (on the metal-highly doped semiconductor contact or on the metal-semiconductor contact or on the metal-tunnel oxide-semiconductor contact) constitute a limiting factor of the efficacy of the solar cell owing to their high recombination activity. A widespread remedial concept is the utilisation of point contacts in order to minimise the unavoidable contact regions of high recombination activity. The photoabsorber (for example the silicon wafer) is passivated over the entire surface by an electrically insulating passivation layer (for example a thermally grown oxide) and is then opened locally in some areas (point contacts or strip contacts). The above-described generation of a space-charge region then takes place in these areas to separate the photogenerated excess charge carriers. In particular, the electrically insulating passivation layer must have a low surface recombination rate (for example <30 cm/s).

Passivation layers reduce the surface recombination rate of the solar cell absorber. They may be conductive (for example intrinsic or doped, hydrogenated, amorphous silicon, a-Si:H) or non-conductive (for example oxides, nitrides). Most passivation layers function primarily by a neutralisation (reduction) of the surface defects of the photoabsorber (for example a thermally grown oxide on a silicon wafer by neutralisation of the open "dangling bonds"). However, it is also possible to obtain a low surface recombination rate via a very high surface charge within the passivation layer. The surface charge of the passivation layer then also leads to a formation of a space-charge region in the photoabsorber. If the surface charge is very high, the resultant band bending of the absorber can be driven until degeneration is achieved or is almost achieved (complete band bending, the valence band edge or the conduction band edge contacts the Fermi energy level of the semiconductor on the surface of the semiconductor). The density of a charge carrier location is then rapidly increased locally on the semiconductor surface. Depending on the material used, only one sort of photogenerated excess charge carrier (either only excess electrons or only excess holes, equivalent to "one polarity" and "opposed polarity") are present there so that, in spite of the possible presence of high surface defect density, no surface recombination is possible. Examples of such passivation layers include, for example, silicon nitride (SiN(acronym, non-stoichiometric formula) deposited on silicon via plasma-protected chemical gas-phase deposition (PECVD), very high positive surface charge) or aluminium oxide (AlO(acronym, non-stoichiometric formula), very high negative surface charge) deposited on silicon via atomic layer deposition (ALD).

In an embodiment, the present invention provides an alternative form of the charge carrier separation for the generic solar cell, wherein the efficacy thereof is to be at least the same or better. Alignment and structuring problems during the production of the solar cell are to be largely avoided by the alternative form of the charge carrier separation.

According to an embodiment of the invention, the solar cell includes:

an alternating neighboring arrangement of a plurality of first and second electrically insulating passivation regions on the rear of the absorber layer having a thickness $L_x$ of $0 < L_x \leq L_{eff,min}$, an arrangement also of the second contact elements on the rear of the absorber layer, at least a first contact opening in each first electrically insulating passivation region for connection of a first contact element and at least a second contact opening in each second electrically insulating passivation region for connection of a second contact element, and a distance $L_y$ between each first and each second contact element of $0 < L_y \leq 2 L_{eff,min}$.

A solar cell contacted on the rear is provided by an embodiment of the invention, in which the selective separation of photogenerated excess charge carriers is achieved with utilisation of field generation by different, undoped, electrically insulating passivation layers with strong opposed surface charge (positive and negative). In their contact regions with the absorber layer, the electrically insulating passivation regions produce degenerated or practically degenerated semiconductor surfaces of opposed doping, which is utilised for selective excess charge carrier separation. Electric fields (space-charge regions) are formed between neighboring passivation regions of opposed surface charge. The photogenerated excess charge carriers are separated and selectively removed in these fields. In order to also reach all generated excess charge carriers in the absorber layer, the absorber layer comprises a thickness $L_x$ of $0 < L_x \leq L_{eff,min}$ for this purpose. It is thus ensured that all free charge carriers can also migrate through the entire thickness of the absorber layer without first recombining. In the case of an undoped absorber layer (intrinsic), positive and negative excess charge carriers occur uniformly and therefore both have approximately the same effective diffusion length $L_{eff}$. In the case of a doped semiconductor as an absorber layer, the doping atoms provide a large number of majority charge carriers so that the effective diffusion length thereof is greater than that of the minority charge carriers, fewer of which are provided. When dimensioning the distances the minimal effective diffusion length $L_{eff,min}$ should thus always be observed, so that the minority charge carriers can also be reliably picked up in the case of doped absorber layers.

In principle, field generators for direct charge carrier separation other than the electrically insulating passivation layers of opposed surface charge are not necessary with the invention. In the solar cell according to an embodiment of the invention the charge carrier separation is not primarily generated by hetero-contact layers formed in a planar or point-like manner or by diffused regions formed in a planar or point-like manner, but is caused primarily by the two electrically insulating passivation layers of opposed surface charge. In addition, doped hetero-layers or doped diffused regions (in particular as contact elements) may optionally be used in a supporting manner, but this is now no longer relevant to function and merely increases the structuring outlay for the advantage of lower contact recombination. The advantage of low contact recombination may advantageously also be achieved with use of a semiconductive, intrinsic passivation layer without structuring outlay.

Compared to the conventional structured solar cells contacted on the rear, in which doped emitters and BSF regions alternate on the rear for field generation for selective charge carrier separation, in the invention it is in particular no longer necessary to insert an insulating passivation layer as a spacer layer between the doped emitter and BSF regions, which considerably reduces the structuring outlay in the case of the invention. In addition, all alignment problems are inapplicable in the case of the invention. In principle, the use of doped semiconductors is not necessary in embodiments of the invention, whereby (intrinsic or weakly doped) absorber layers which are less prone to defects can advantageously be used.

In the solar cell according to an embodiment of the invention both contact systems are arranged on the rear of the solar cell, which is turned away from the incident light during operation. At least one contact opening is provided in each first electrically insulating passivation region for connection of a first contact element to the absorber layer. Together with corresponding collector elements, all first contact elements form a first contact system, via which all selected excess charge carriers of one polarity are dissipated (for example, in doped absorber layers the majority charge carriers in accordance with the doping). At least one contact opening is provided in each second electrically insulating passivation region for connection of a second contact element to the absorber layer. Together with corresponding collector elements, all second contact elements form a second contact system, via which all selected charge carriers of opposed polarity are dissipated (for example, in doped absorber layers the minority charge carriers in accordance with the doping). It is thus ensured that all photogenerated excess charge carriers also enter the field of influence of the passivation layers, where they can be removed separately at the correct contact elements, a distance $L_y$ of $0<L_y \leq 2L_{eff,min}$ always being provided between each first and second contact element. The shorter the distance between the contact elements, for example $0<L_y<L_{eff,min}$, the better is the detection and removal of the separated excess charge carriers via the corresponding contact elements. It can thus be ensured that, at any point, the excess minority charge carriers generated in the absorber (the collection of which is considerably more difficult than the collection of the majority charge carriers) reach the passivation regions or contacts collecting minority charge carriers before they recombine in the absorber.

The first and second contact elements are preferably point-like or strip-like in form (this also includes grid-like structures) so that the contact areas with the absorber layer, which have high recombination rates, are largely minimised. Other embodiments of the contact elements are also possible, however. It is further advantageous, for excess charge carrier collection over the entire surface which is as uniform as possible, for the contact openings to be arranged in the region of the centroids of the first and second passivation regions. Other, for example asymmetrical arrangements are also possible, however. Furthermore, a plurality of particularly small contact openings may also advantageously be provided per passivation region. The contact openings may have nanoscale dimensions and may be distributed randomly. For this, a preferred production method is described herein. The provision of a plurality of contact openings significantly increases the selectivity of excess charge carrier dissipation, since the degeneration of the absorber surface produced by the passivation regions may extend fully into the contact openings.

The metal contact elements preferably consist of two different metals of different work function, wherein the required work function is determined in such a way that the metal/semiconductor contact to the intrinsic passivation layer (a-Si:H(i)) leads to an electron-concentrating surface if it is located on a passivation region of high negative surface charge, and leads to a hole-concentrating surface if it is located on a passivation region of high positive surface charge. Similarly to the doped regions, the different work function of the metal contact elements thus assists the selective excess charge carrier separation in the region of the center of the contact openings, into which, depending on the selected size of the contact openings, the space-charge regions of the absorber generated by the passivation layer no longer reach or are significantly reduced in terms of their effect.

To further improve the efficacy of the solar cell, a planar passivation layer may also advantageously be provided on the front of the absorber layer. This passivation layer does not necessarily actively contribute to selective charge carrier separation, but lowers the recombination rate on the surface of the substrate layer so that pure surface passivation occurs. In addition, the front passivation layer may advantageously also consist of two different insulating passivation layers of opposed high surface charge (for example opposed identically to the two passivation regions on the rear of the solar cell) so as to assist the selective excess charge carrier separation from the front (location of the primary excess charge carrier generation) to the back (location of excess charge carrier dissipation) by an incorporated electric field (in turn generated by the insulating passivation regions). This may be relevant in particular for thin-layer absorbers (for example intrinsic, amorphous silicon, a-Si:H(i)), in which a purely diffusion-driven collection of the excess charge carriers on the rear owing to the relatively high defect densities thereof is not advantageous. The collection of charge carriers on the rear is also field-assisted.

It is further advantageous if, to minimise the recombination-active junction between the metal contact elements and the semiconductive absorber layer, a planar or structured, electrically conductive, intrinsic passivation layer is provided on the first and second passivation regions. It is further advantageous if a narrow, thin, electrically insulating third passivation region without high surface charge is provided between the first and second passivation regions, which third passivation region assists the neutralisation of degeneration or close degeneration at the edges of the first and second passivation regions and thus avoids a short circuit.

In principle, in the case of the invention doped or undoped (intrinsic) semiconductor materials can be used to produce the absorber layer. In order to further improve the efficacy it may be advantageous when using doped semiconductive absorber layers if the metal contacting is achieved by doped homo- or hetero-semiconductor contacts. With a doped absorber layer, oppositely doped heterogeneously applied or diffused emitter layers may advantageously be provided, at least in the contact openings of the first or second passivation regions which have a surface charge identical to the absorber doping. A p-doped absorber layer is thus the electrically insulating second passivation region with a high positive surface charge, in the contact openings of which the negatively doped emitter layers are located. In the case of an n-doped absorber layer positively doped emitter layers would be located in the contact openings of the electrically insulating first passivation regions with a high negative surface charge. Furthermore, for the doped absorber layer identically doped heterogeneous BSF layers diffused locally or over the entire surface may be provided, at least in the contact openings of the first or second passivation regions with opposed surface charge to the absorber doping. A p-doped absorber layer is thus the electrically insulating first passivation region with a high negative surface charge, in the contact openings of which the positively doped BSF (back surface field) layers are located. By contrast, in an n-doped absorber layer negatively doped BSF layers would be located in the contact openings of the electrically insulating second passivation regions with a high positive surface charge.

It is further advantageous, for improved contacting of the hetero-contacts arranged in the contact openings by the first and second contact elements, for the emitter layers and/or BSF layers to extend from the contact openings to the first and/or second passivation regions, but without mutual contact. Contact elements of greater area can then be arranged over the extended regions. Similarly, additional emitters and/or BSF layers can also be applied to the previously applied electrically conductive passivation layer, which then extends into the contact openings. If both additional emitter and BSF layers are applied, these must not come into contact.

In the case of the solar cell according to an embodiment of the invention the contacts can thus ideally be formed by point-like or strip-like hetero-contacts which exhibit low recombination and, however, do not necessarily contribute to the formation of a space-charge region (for example a-Si:H (i), intrinsic, amorphous, hydrogenated silicon). In particular, if the diameter of the point contacts or the width of the strip contacts is selected to be less than twice the mean width of the space-charge regions of the respective excess charge carriers, the electric field of the respective passivation region thus also acts in a selectively separating manner in the regions of the contacts. If the diameter or width is greater, the selective charge carrier separation thus only takes place in the junction edge regions of the space-charge regions. In the case of an intrinsically selected photoactive absorber layer, this may be compensated for, however, by a coating of the contacts with an intrinsic, conductive hetero-passivation layer. The contact with the absorber layer is then passivated in the inner region of the point- or strip-contact and the selective excess charge carrier removal takes place in the edge region. In the case of a doped photoactive absorber layer, if the structure sizes of the contacts are greater than twice the mean width of the space-charge regions then the contact openings of the excess minorities can thus be modified by additional, externally applied doped hetero-contact layers or by local diffusion so that the semiconductor surface of the absorber layer also contributes there to the selective excess carrier charge removal. The point- or strip-like contacts are ideally formed by hetero-contacts which exhibit poor recombination and which do not necessarily have to contribute to the production of degeneration, similarly to the degeneration of the semiconductor surface produced by the respective passivation layer (for example a layer made of intrinsic, amorphous silicon, which in turn is contacted resistively by metal). However, conventional contactings for the contacts may of course also be used (although, disadvantageously, recombination is more active), which then assist the selective charge carrier separation of the passivation regions.

If, for example, in particular hydrogenated, intrinsic, amorphous silicon (a-Si:H(i)) is used as a conductive passivation layer for point-contacting of a, for example, ideally intrinsic silicon wafer as a photo absorber, it is known that ultra-thin (for example 30 nm thick) a-Si:H(i) as a conductive passivation layer passivates just as well as the best currently known insulating passivation layers (for example $SiO_2$, $Si_3N_4$, $Al_2O_3$). For example, in accordance with the invention a-Si:H(i) is used to contact the point-like or strip-like contactings of the wafer. Since the insulating passivation regions already ensure selective charge carrier separation, it is now no longer necessary to apply further highly doped (recombination-active) semiconductor layers for selective charge carrier separation on or below the intrinsic a-Si:H(i) layer. In particular, only one conductive passivation layer is then required and not two different types, as was previously usual in the prior art (a passivation layer for dissipation of the excess electrons and a passivation layer for dissipation of the excess holes). Depending on the insulating passivation layer on which the a-Si:H(i) is located, either excess electrons or excess holes are dissipated. This reduces the structuring outlay considerably, in particular in the embodiment of a solar cell contacted on the rear.

Furthermore, in the case of the solar cell according to an embodiment of the invention, feedthroughs in the passivation layer towards the front of the solar cell or absorber layer, which faces the incident light during operation, may be provided. The insulating passivation layer applied on the front of the absorber layer then advantageously also contributes to the selective excess charge carrier separation and the excess charge carriers collected on the front are removed via the feedthroughs to a contact system arranged on the rear, which system is designed similarly to that described above. The solar cell according to an embodiment of the invention may preferably be characterised by a doped absorber layer, a feedthrough of the contact openings in the first or second passivation regions with identical surface charge to the absorber doping as far as the front of the absorber layer, and a coating of the fed-through contact openings and of the front of the absorber layer between the fed-through contact openings with the material of the first or second passivation regions. In a p-doped absorber layer the absorber layer accordingly passes through the contact openings in the second passivation regions with positive surface charge and said contact openings are coated with the material of the second passivation regions. By contrast, in an n-doped absorber layer the absorber layer passes through the contact openings in the first passivation regions with negative surface charge and said contact openings are coated with the material of the first passivation regions.

As already indicated above in some examples, in the solar cell intrinsic or doped silicon may preferably be used as a material for the absorber layer, silicon nitride as a material for the electrically insulating first passivation regions with a high positive surface charge, aluminium oxide as a material for the electrically insulating second passivation regions with a high negative surface charge, and aluminium or TCO (transparent conductive oxide)/aluminium as a material for the first and second contact elements. Hydrogen-minimised, amorphous silicon (a-Si:H) may preferably be used as a material for the electrically conductive intrinsic passivation layer.

FIG. 1A shows a cross-section of the basic structure of a solar cell 01 according to an embodiment of the invention. On the rear 02 of the solar cell 1, which is turned away from the light during operation (see arrows for incident light), first passivation regions 04 with a high negative surface charge and second passivation regions 05 with a high positive surface charge are arranged alternately on a semiconductive absorber layer 03 which may be doped intrinsically (03) or positively (20) or negatively. Furthermore, the forming space-charge regions 06 beneath the first passivation regions 04 with high negative surface charge (the concentration of positive charges in the surface of the absorber layer 03 is also shown) and the space-charge regions 07 beneath the second passivation regions 05 with high positive surface charge (the concentration of negative charges in the surface of the absorber layer 03 is also shown) and the forming electric fields 08 are illustrated (not to scale). It can be seen that all excess charge carriers generated in the absorber layer 03 can migrate in accordance with their polarity to first contact elements 09 (removal of positive excess charge carriers) in the first passivation regions 04 and to second contact elements 10 (removal of negative excess charge carriers) in the second passivation regions 05.

So that all charge carriers from the entire absorber layer 03 also reach the space-charge regions 06, 07 (with a width W), the thickness $L_x$ of the absorber layer 03 is less than or equal to the smallest effective diffusion length $L_{\mathit{eff},min}$ occurring in the absorber layer 03 ($0<L_x \leq L_{\mathit{eff},min}$). The first and second contact elements 09, 10 are arranged in first contact openings 11 and second contact openings 12. So that all photogenerated charge carriers in the space-charge regions 06, 07 can reach the first and second contact elements 09, 10, the contact openings 11, 12 are arranged at a distance $L_y$ from one another, which distance is less than or equal to twice the smallest effective diffusion length $L_{\mathit{eff},min}$ occurring in the absorber layer 03 ($0<L_y \leq 2 L_{\mathit{eff},min}$). A particularly reliable removal of the charge carriers is achieved if $L_y$ is less than or equal to the effective diffusion length $L_{\mathit{eff},min}$ ($0<L_y \leq L_{\mathit{eff},min}$). In the selected embodiment the contact openings 11, 12 are each arranged in the centroids of the first and second passivation regions 04, 05.

Figure 1B:
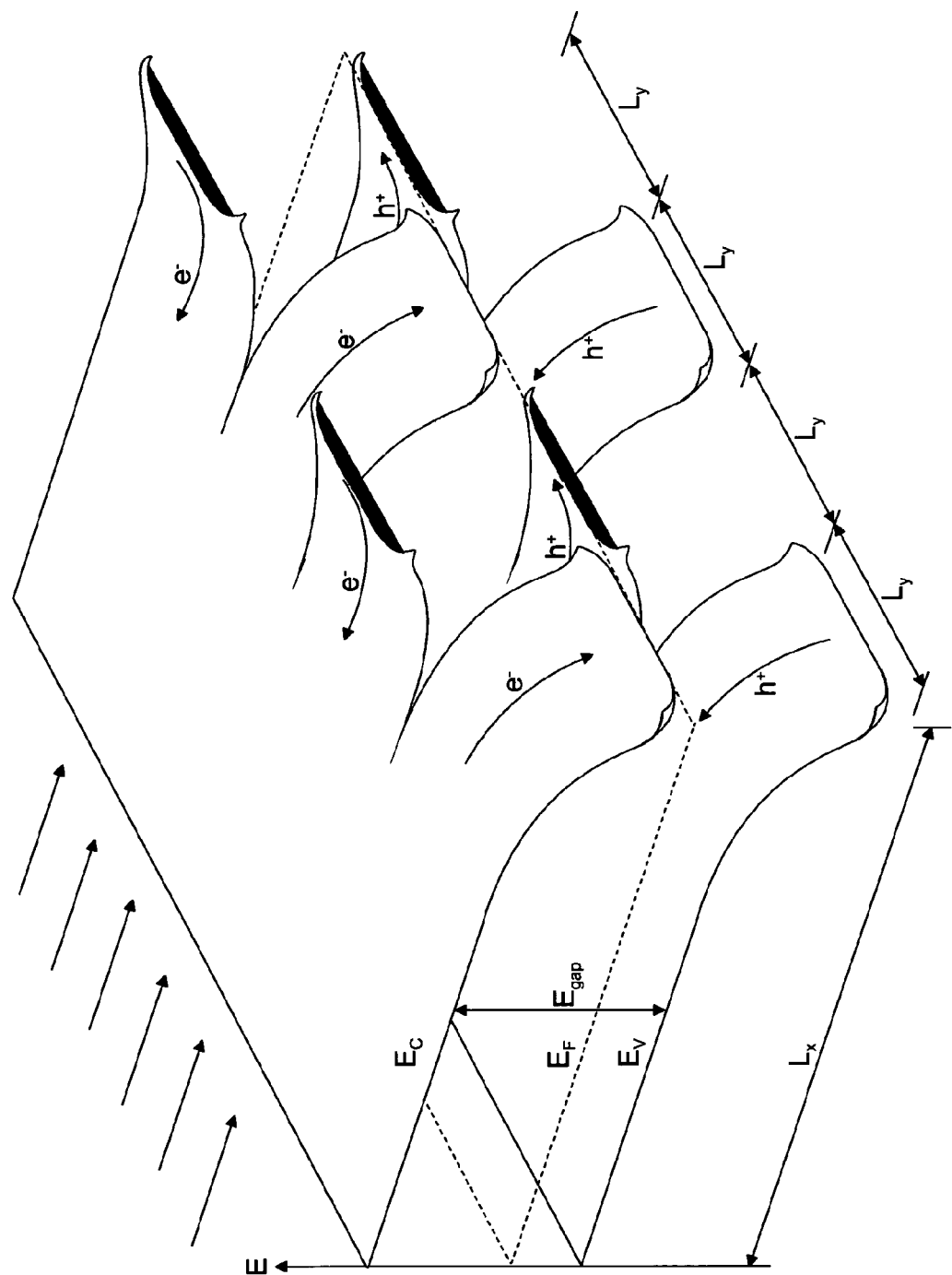
FIG. 1B is a three-dimensional principle view of the band diagrams.

FIG. 1B shows the action of the passivation regions 04, 05, which are not electrically conductive and consist of undoped, non-semiconductive materials with high positive or negative surface charge, on the basis of band diagrams of the absorber with the energy curve ($E_V$ valence band, $E_F$ Fermi level, $E_C$ conduction band) over the thickness $L_x$ of the absorber layer 03 and the distance $L_y$ of the contact openings 11, 12. Owing to the high surface charges (defect states) of the passivation regions 04, 05, there is a concentration of oppositely charged excess charge carriers in the surface of the absorber layer 03 so that no surface recombination for the other excess charge carriers of opposed polarity is possible (easily passivated surface with low recombination rate). Band bending occurs until degeneration (no other excess charge carriers now reach the surface) or close to degeneration (few other excess charge carriers still reach the surface). The respective degeneration can be seen, that is to say excess charge carriers with the same charge ($e^-$ for electrons, negative polarity, $h^+$ for holes, positive polarity) as the corresponding passivation regions 04, 05 do not reach the respective surface of the absorber layer 03. The degeneration is increased along the edges where the two passivation regions 04, 05 with the oppositely high surface charge densities come into contact, since the resultant net total charge is low in the vicinity of the edge (difference between positive and negative surface charge). The field thus progresses in such a way that excess electrons and holes are collected in the "centres" of the passivation regions 04, 05 on the semiconductor surface of the absorber layer 03. In particular, internal recombination of excess electrons and holes does not then occur at the edges.

Figure 2A:
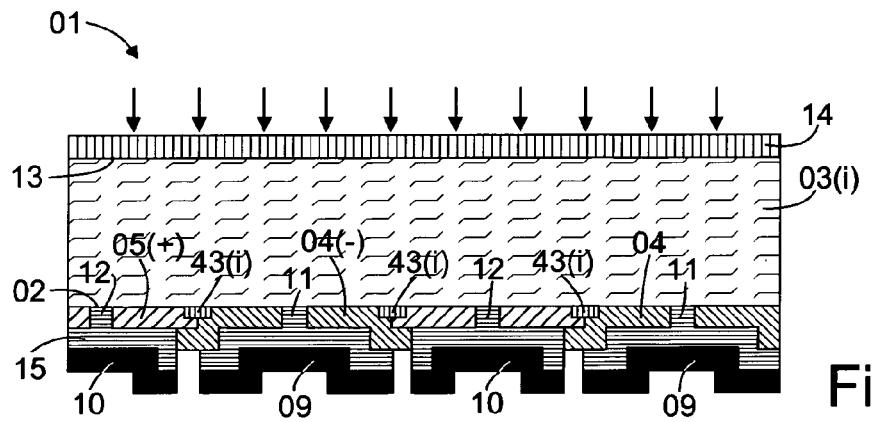
FIG. 2A with an intrinsic absorber, a third electrically insulating passivation region (uncharged) and both contactings via an intrinsic hetero-layer, structured.

The neutralisation of the degeneration or close degeneration at the edges can be reinforced further by placing a thin, strip-like, electrically insulating third passivation region 43 without high surface charge (for example $SiO_2$) between the two passivation regions 04, 05 with high surface charge (see FIG. 2A).

The subsequent figures show different embodiments of the solar cell 01 according to an embodiment of the invention in terms of the layer structure and the design of the two contact systems. Reference numerals which are not included in individual figures are to be inferred from the previous figures and from the description.

It is known that ultra-thin (for example 30 nm thick) a-Si: H(i) as a conductive passivation layer passivates just as well as the best currently known insulating passivation layers (for example $SiO_2$, $Si_3N_4$, $Al_2O_3$). For example, hydrogenated, intrinsic, amorphous silicon (a-Si:H(i)) can be used in the invention as an electrically conductive passivation layer for point-contacting of a, for example, intrinsic silicon wafer as a photoactive absorber layer 03. Furthermore, a-Si:H(i) can also be used for contacting of the point-like (or strip-like) contact elements of the absorber layer. Since the insulating passivation layers already ensure selective charge carrier separation, it is no longer necessary in the solar cell according to an embodiment of the invention to apply further, highly doped and thus recombination-active semiconductor layers for selective charge carrier separation on or below the intrinsic a-Si:H(i) layer. In particular, only one conductive passivation layer is then still required instead of two different types, as was previously usual (one for dissipation of excess electrons and one for dissipation of excess holes). Depending on the insulating passivation region (negative or positive surface charge) on which the a-Si:H(i) is located, either excess electrons or excess holes are dissipated. This reduces the structuring outlay considerably, in particular in the embodiment of a solar cell contacted on the rear according to FIGS. 2A, 2B and 2C.

Figure 2B:
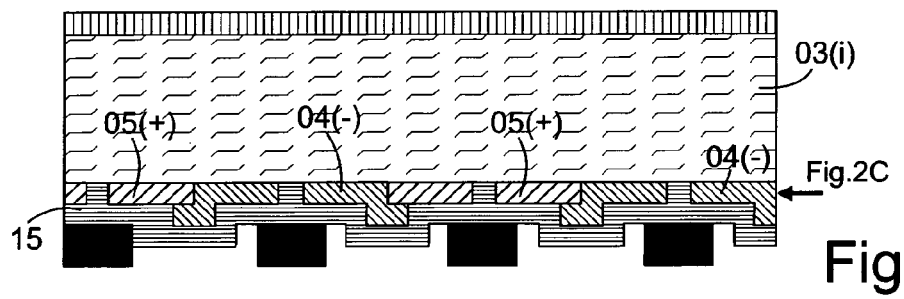
FIG. 2B with an intrinsic absorber and both contactings via an intrinsic hetero-layer, unstructured.

FIGS. 2A and 2B show a schematic cross-section (not to scale) of a solar cell 01 according to an embodiment of the invention. A planar passivation layer 14 (for example SiN, for example $Si_3N_4$ or $SiO_2$) for good surface passivation of the intrinsic absorber layer 03 (for example intrinsic silicon wafer) is further arranged on the front 13, which faces the incident light (arrows) during operation, but does not necessarily contribute to charge carrier separation. Electrically insulating first passivation regions 04 with high negative surface charge (for example AlO, for example $Al_2O_3$) and second passivation regions 05 with high positive surface charge (for example SiN) are arranged alternately on the rear $O_2$ of the absorber layer 03. An electrically conductive, intrinsic passivation layer 15 (for example made of intrinsic, amorphous silicon, a-Si(i)) (FIG. 2A: structured, FIG. 2B: planar) is further arranged on both regions 04, 05 to reduce the recombination rate. The electrically conductive, intrinsic passivation layer 215 contacts the absorber layer 08 via point-like contact openings 11, 12. The first contact elements 09 (for example Al or TCO/Al) and the second contact elements 10 (for example Al or TCO/Al) are larger (FIG. 1A) or smaller (FIG. 2B) in accordance with the structuring of the electrically conductive, intrinsic passivation layer 15.

A thin, strip-like, electrically insulating third passivation region 43 without high surface charge (for example $SiO_2$) is also additionally provided between the two passivation regions 04, 05 in FIG. 2A. It reliably assists the neutralisation of the degeneration or close degeneration at the edges of the two electrically insulating passivation regions 04, 05 (see FIG. 1B).

Figure 2C:
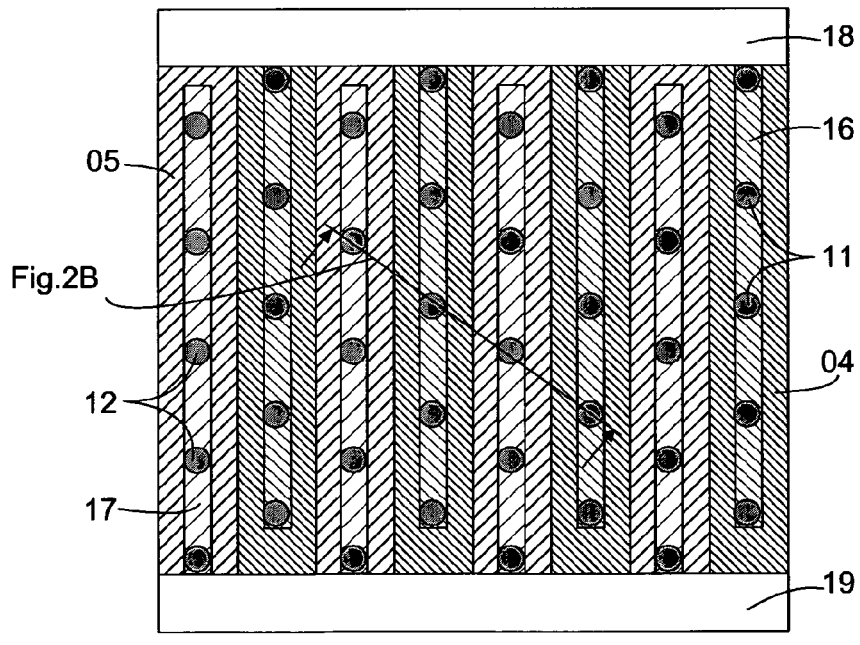
FIG. 2C according to FIG. 2B in cross-section with parallel contactings.

FIG. 2C shows a longitudinal section along the lateral arrow in FIG. 2B of the first and second passivation regions 04, 05 with the contact elements 09, 10. It can be seen that in each passivation region 09, 10 a plurality of point-like contact openings 11, 12 (in this case formed by the electrically conductive, intrinsic passivation layer 15) and connecting contact strips 16, 17 (in this case formed of aluminium strips) are arranged in the embodiment of parallel metallisations which are each consolidated in lateral busbars 18, 19. The sectional line for the cross-section according to FIG. 2B is again shown in FIG. 2C.

If a doped silicon wafer (doped charge: majority charge carriers or majorities, opposed charge: minority charge carriers or minorities) is used as a photoactive doped absorber layer 20 and the structure size of the contact elements 09, 10 is greater than twice the mean width W of the charge-space zones 06, 07, only the excess majorities can still be removed without difficulty via point-contacting with a conductive, intrinsic hetero-contact layer (for example a-Si:H(i)). Depending on the size of the point-contactings, the semiconductor surface of the doped absorber layer 20 at the minority contact points, that is to say in the edge regions still close to degeneration, is in inversion (collection of minorities on the semiconductor surface), however, towards the centre of the point-contactings it then goes from the inversion into a flat band situation (collection of majorities on the semiconductor surface owing to the absorber doping) so that the contact then no longer acts selectively for the dissipation of the excess minorities of the absorber. By contrast, the semiconductor surface of the majority contacts then goes from an accumulation (collection of majorities on the semiconductor surface) to a flat band situation (collection of majorities on the semiconductor surface owing to the absorber doping) so that this contact thus also remains selectively for the dissipation of the excess majorities of the absorber.

The point contacts are thus either to be formed very small (and therefore the number of point-contactings is to be selected to be very high), possibly by specific manufacturing methods (for example interference method or else by a method for generating randomly arranged nanopoint-contacts—this will be described further below), or doped hetero-contact layers (see FIGS. 3A to 3F) or doped, conventionally diffused regions (see FIGS. 4A to 4B) are to be used, at least to dissipate the excess minorities. If the doped layers for dissipating the excess majorities are omitted, the structuring outlay in the case of the solar cell according to an embodiment of the invention can also be reduced considerably. In addition, in the case of a conventional diffusion a less pronounced (and therefore also less recombination-active) doping is sufficient.

Figure 3A:
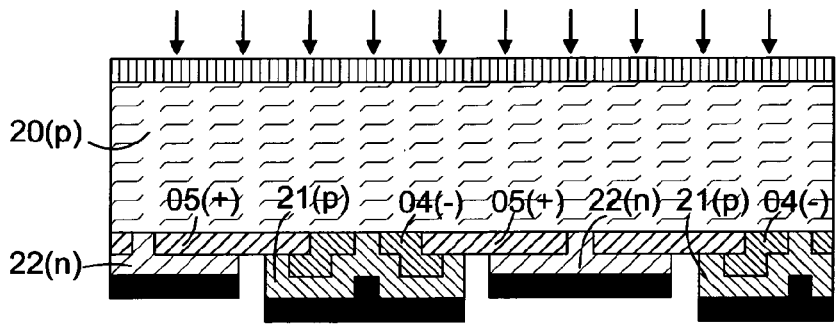
FIG. 3A with a doped absorber and both contactings via a doped hetero-layer, structured.

FIG. 3A shows a doped absorber layer 20 (for example p-doped) with a planar passivation layer 14 on the front 13 and, on the rear 02, alternately arranged insulating first and second passivation regions 04, 05. A hetero-BSF (back surface field) layer 21 with the same doping as the absorber layer (in this case p-doped) is arranged on the first passivation regions 04 (negative surface charge) and a heterogeneous emitter layer 22 with opposite doping to the doped absorber layer 20 (in this case n-doped) is arranged on the second passivation regions 05 (positive surface charge). However, the pn junction formed between the doped absorber layer 20 and the oppositely doped heterogeneous emitter layer 22 is primarily used for improved charge dissipation and only contributes to charge carrier separation to a subordinate degree. First contact elements 09 for dissipating the positive excess charges are arranged on the heterogeneous BSF layer 21 and second contact elements 10 for dissipating the negative excess charges are arranged on the heterogeneous emitter layer 10.

Figure 3B:
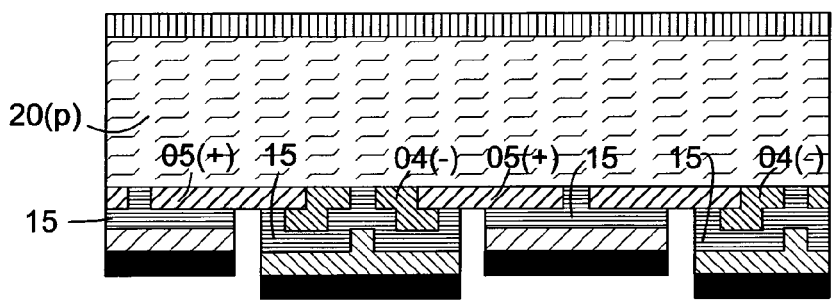
FIG. 3B with a doped absorber and both contactings via a doped hetero-layer and an intrinsic hetero-layer, structured.
Figure 3C:
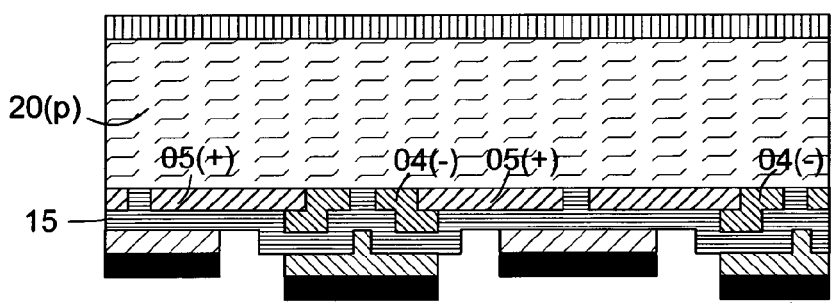
FIG. 3C with a doped absorber and both contactings via a doped hetero-layer and an intrinsic hetero-layer, unstructured.
Figure 3D:
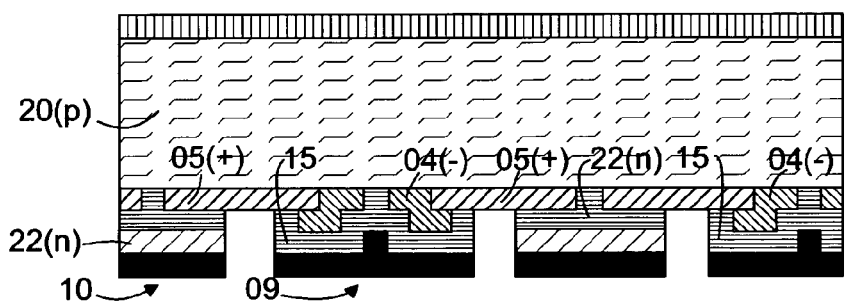
FIG. 3D with a doped absorber and minority contacting via a doped hetero-layer and an intrinsic hetero-layer, structured, and majority contacting via an intrinsic hetero-layer, structured.
Figure 3E:
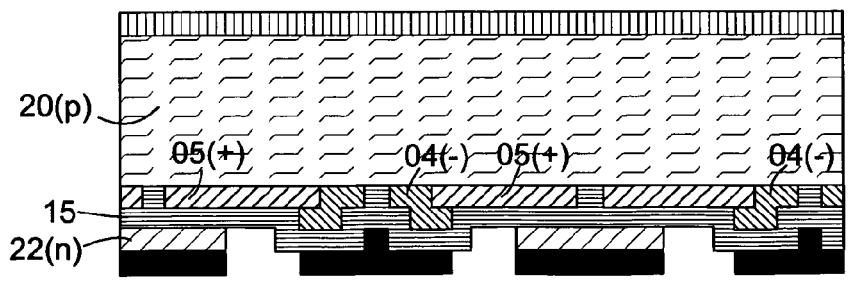
FIG. 3E with a doped absorber and minority contacting via a doped hetero-layer and an intrinsic hetero-layer, unstructured, and majority contacting via an intrinsic hetero-layer, unstructured.

In FIG. 3B an electrically conductive, intrinsic passivation layer 15 is additionally arranged on the first and second passivation regions 04, 05 (FIG. 3B: structured, FIG. 3C: planar). In FIG. 3D only the heterogeneous emitter layer 22 is provided in addition to the electrically conductive, intrinsic passivation layer 15 (FIG. 3D: structured, FIG. 3E: planar). The heterogeneous BSF layer 21 is not provided, which reduces the structuring outlay.

Figure 4A:
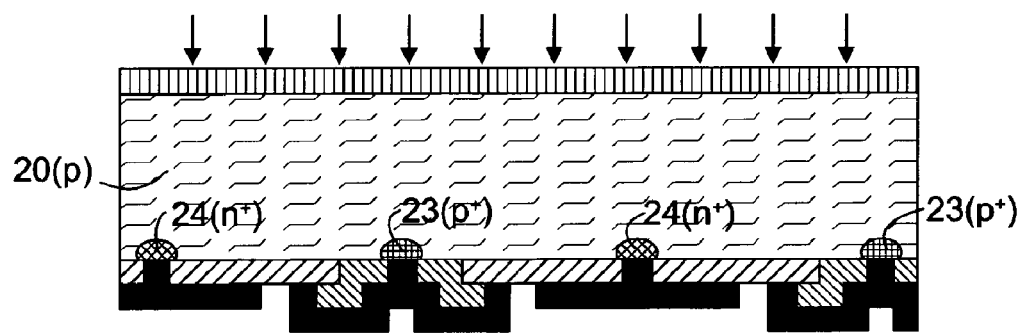
FIG. 4A with a doped absorber and both contactings via conventional diffusion.
Figure 4B:
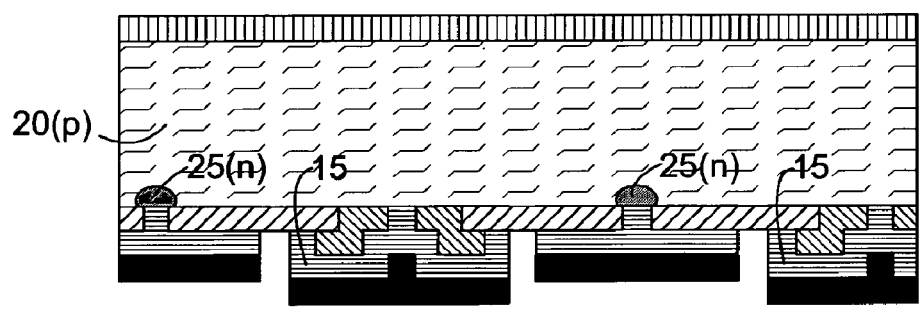
FIG. 4B with a doped absorber and minority contacting via conventional diffusion and an intrinsic hetero-layer, structured, and majority contacting via an intrinsic hetero-layer, structured.

FIG. 4A corresponds to FIG. 3A, wherein in FIG. 4A diffused BSF layers 23 (with high doping identical to the doped absorber layer 20) and diffused emitter layers 24 (with high doping opposite to the doped absorber layer 20) are provided. FIG. 4B corresponds to FIG. 3D, wherein in FIG. 4B only the locally diffused emitter layer 25 (with simple doping opposite to the doped absorber layer 20) is shown.

In the configurations indicated (intrinsic absorber, doped absorber with doped hetero-contact layers or conventionally doped diffused regions), the absorber is primarily passivated with planarly separated insulating passivation layers (with high different surface charge), and these take on the selective excess charge carrier separation. The excess charge carriers are then dissipated via point- or strip-like contact openings (via a hetero-contact layer, all figures apart from FIGS. 4A and 4B, or via diffused regions, FIGS. 4A and 4B). Owing to the arrangement of two electrically insulating passivation layers in regions on the rear of the absorber, any alignment problems are avoided since the insulating passivation layers may also overlap in part without difficulty. If conventionally diffused regions are avoided by the use of hetero-layers, the contact recombination can thus be significantly reduced: on the one hand the solar cell absorber still exhibits poor recombination (no recombination-active, highly doped, diffused regions), and on the other hand the suitably selected band offsets of the hetero-contact reduce contact recombination.

Hybrid combinations (one contact type is provided by conventional diffusion, the other by hetero-layers) are of course also conceivable but are not described in detail here.

The efficacy of these illustrated solar cell structures according to an embodiment of the invention may thus be increased significantly compared to the known homo solar cells contacted on the rear, with a simultaneous significant reduction in the structuring outlay. The structuring outlay is also considerably reduced compared to previously known concepts of hetero solar cells contacted on the rear (two different, structured hetero-contact layers do not have to be applied, but ideally only one, unstructured hetero-contact layer). Owing to the interfacial damage of the a-Si:H/c-Si interface to be expected by the structuring and the improved passivation effect of an intrinsic a-Si:H layer compared to an intrinsic/doped a-Si:H double layer, a considerably higher solar cell efficacy is also to be expected in this instance.

"Pseudo-emitter warp-through" structures are also conceivable in the solar cell according to an embodiment of the invention (see FIGS. 5A to 5F). These structures may advantageously be used if a doped photoabsorber (for example doped c-Si wafer) with relatively poor absorber life span is used, and therefore the collection of photogenerated excess minorities on the rear is problematic.

The photoabsorber is coated on the front with an insulating passivation layer with high surface charge of the same sign as the photoabsorber (that is to say, for example, in the case of a p-doped photoabsorber a passivation layer with high positive surface charge). Practically degenerated minority charge carrier semiconductor surfaces are produced by additional "pseudo-vias", that is to say simple through-holes in the photoabsorber which are filled with the same material as the passivation layer on the front. The minorities are then collected on the front and guided along the front (on the degenerated semiconductor surface) to the vias, along these (also on the degenerated semiconductor surface) and are then guided to the rear of the photoabsorber. Here, they are collected by the previously described contact system (see FIGS. 5A to 5C). Should the transverse conductivity of the pure absorber material be insufficient, this may of course be increased further by a conventional, planar diffusion (see FIGS. 6A and 6B).

Figure 5A:
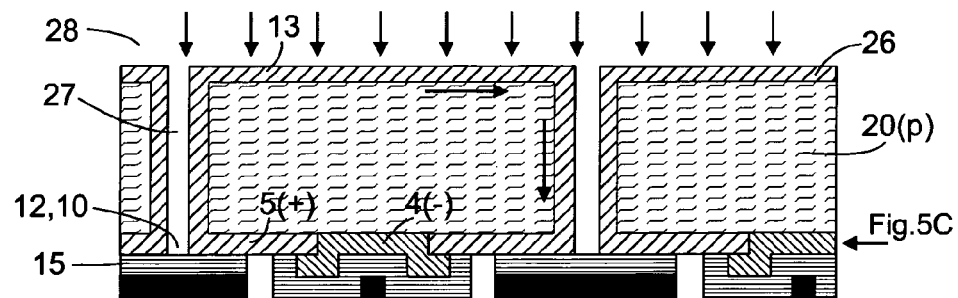
FIG. 5A with a doped absorber and pseudo-vias, minority contacting via an intrinsic hetero-layer and local diffusion, structured, and majority contacting via an intrinsic hetero-layer, structured (first cross-section)
Figure 5B:
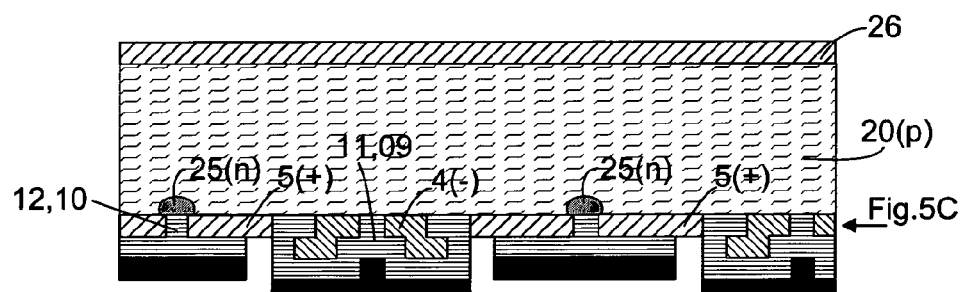
FIG. 5B with a doped absorber and pseudo-vias, minority contacting via an intrinsic hetero-layer and local diffusion, structured, and majority contacting via an intrinsic hetero-layer, structured (second cross-section)
Figure 5C:
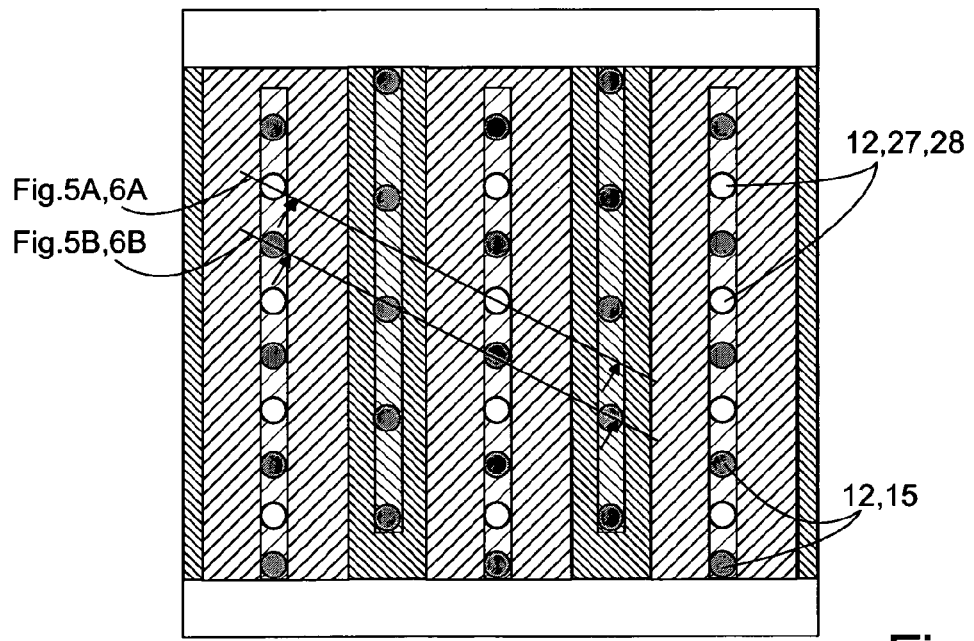
FIG. 5C according to FIGS. 5A, 5B and 6A, 6B in cross-section with parallel contactings.

FIG. 5A shows on the front 13 of the doped absorber layer 20 (in this case p-doped) a planar passivation layer 26 with the same surface charge as the second passivation layer 05 with high positive surface charge. Identical material, for example silicon nitride, is advantageously used. In the selected embodiment the contact holes 12 in the second passivation regions 05 with high surface charge are formed as feedthroughs 27 as far as the front 13 of the absorber layer 20. The feedthroughs are also coated with a passivation having the same surface charge as the second passivation regions 05. In this case, too, identical material is advantageously used. Pseudo-vias 28 are produced. Not every contact hole 12 is passed through. The respective other contact holes 12 in turn comprise a diffused emitter layer 25 with opposite doping compared to the absorber layer 20 (see FIG. 4B). The migration path of the minority charge carriers is illustrated by arrows in the absorber layer 20. FIG. 5C in turn shows a view onto the point indicated by an arrow in FIGS. 5A and 5B (see FIG. 2C). The sectional planes for FIGS. 5A and 5B are shown. The unfilled contact holes 12 or feedthroughs 27 and the contact holes 12 filled with the electrically conductive, intrinsic passivation layer 15 can be seen. Similarly reversed conditions are provided in an n-doped absorber layer. However, all pn junctions formed do not primarily contribute to charge carrier separation. This is substantially achieved by the oppositely charged first and second passivation regions 04 and 05.

Figure 6A:
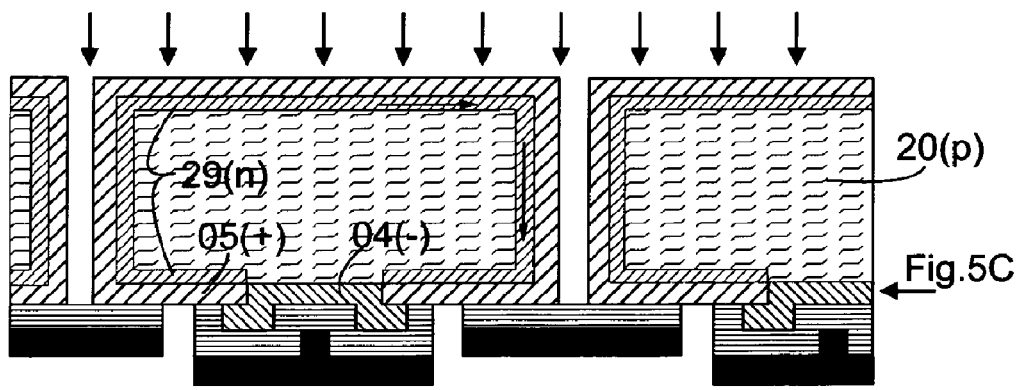
FIG. 6A with a doped absorber and pseudo-vias, minority contacting via an intrinsic hetero-layer and planar diffusion, structured, and majority contacting via an intrinsic hetero-layer, structured (first cross-section)
Figure 6B:
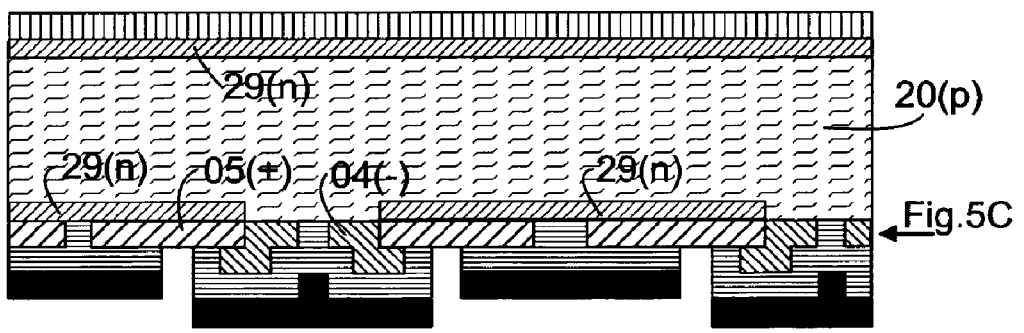
FIG. 6B with a doped absorber and pseudo-vias, minority contacting via an intrinsic hetero-layer and planar diffusion, structured, and majority contacting via an intrinsic hetero-layer, structured (second cross-section)

FIGS. 6A and 6B show a similar structure to FIGS. 5A and 5B, but in this case the emitter layer 29, which is normally doped oppositely to the absorber layer 20, is diffused in a planar manner. FIG. 5C also applies to FIGS. 6A and 6B.

Figure 7A:
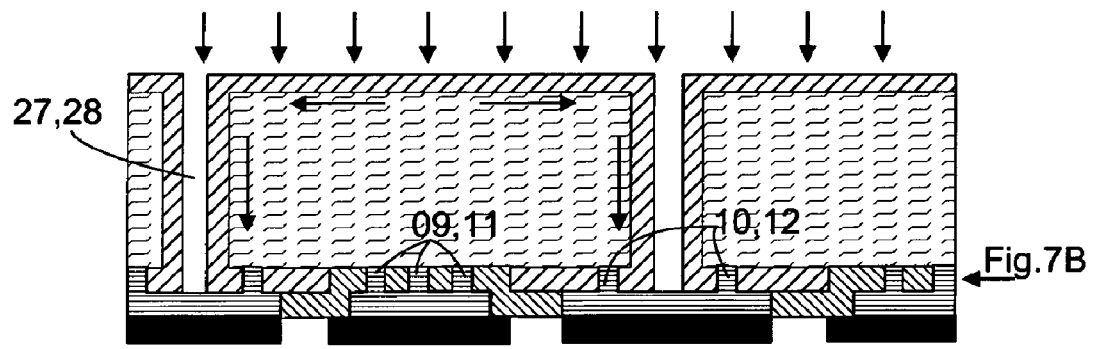
FIG. 7A with an intrinsic or doped absorber and pseudo-vias and many point-contactings via an intrinsic hetero-layer, structured.
Figure 7B:
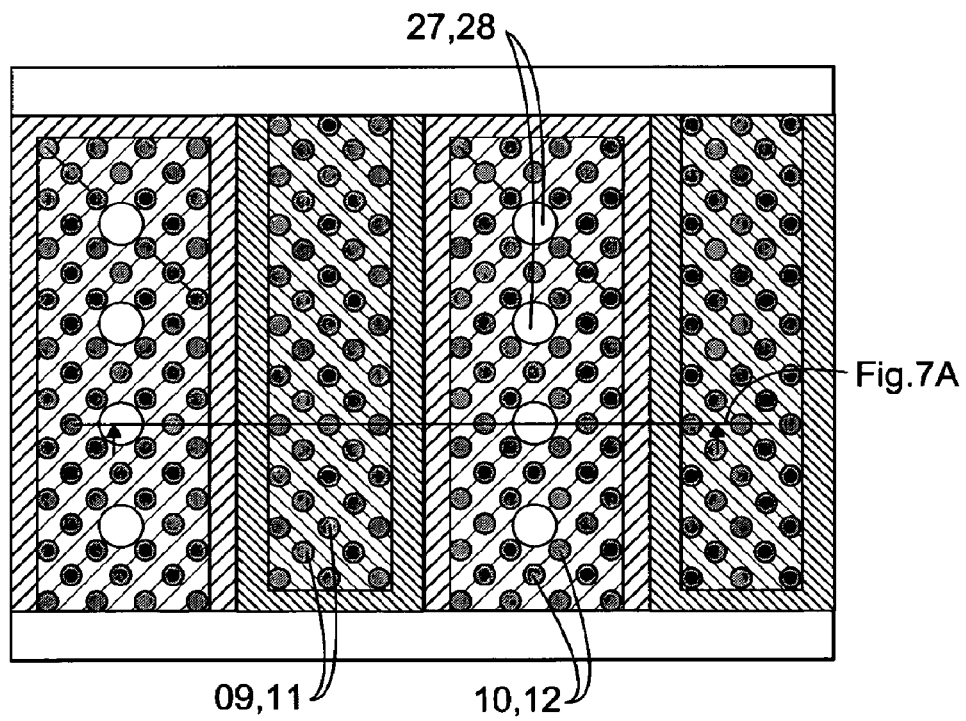
FIG. 7B according to FIG. 7A in cross-section with many contactings.

FIGS. 7A and 7B show similar embodiments to FIGS. 5A and 5C, but now with a plurality of point-like first contact elements 09 (in contact openings 11) and point-like second contact elements 10 (in contact openings 12) and a plurality of vias 28 (in feedthroughs 27).

For the sake of completeness solar cell structures contacted on both sides (a contact system on the front and one on the rear of the solar cell) according to an embodiment of the invention (charge carrier separation basically by the oppositely charged first and second passivation regions) can be provided. However, these structures pose the drawback that, as a result of the conductive passivation layer arranged on the front and any further layers arranged on the front, the photoabsorption in these layers does not contribute to excess charge carrier generation in the photoabsorber. In this case a front solar cell structuring would therefore have to be provided, but this is advantageously formed on the rear of the solar cell so as to avoid the shading caused by the front contact system at the same cost. These structures are therefore only useful if the quality of the photoabsorber is too low to collect on the rear (the excess charge carriers generated primarily at the front recombine on the way to the rear of the solar cell).

Figure 8A:
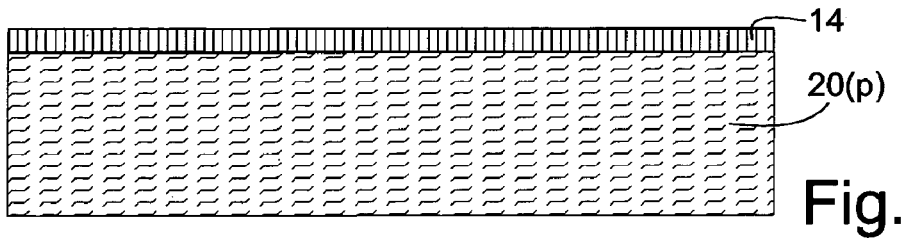
FIGS. 8A to N show a conventional production method with rough structuring of the passivation regions.
Figure 8B:
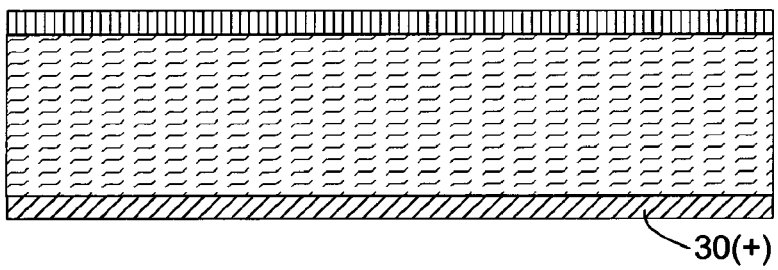
Figure 8C:
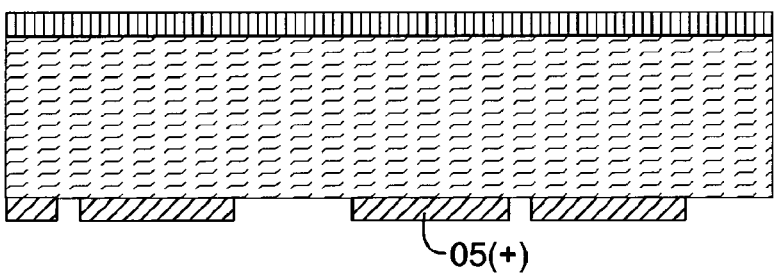
Figure 8D:
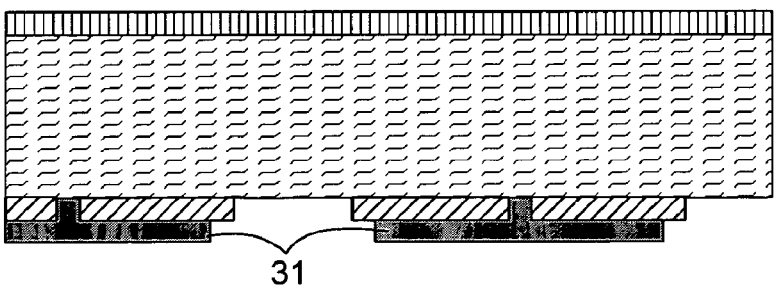
Figure 8E:
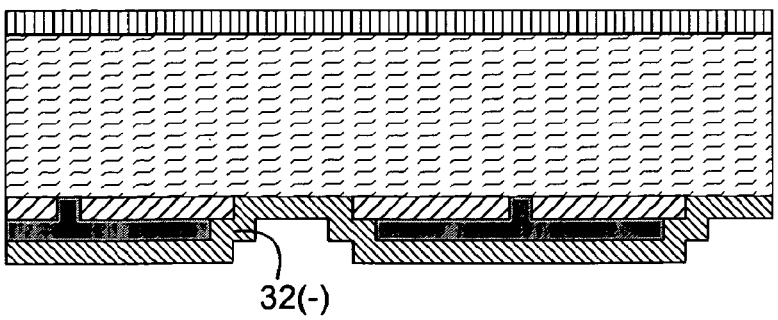
Figure 8F:
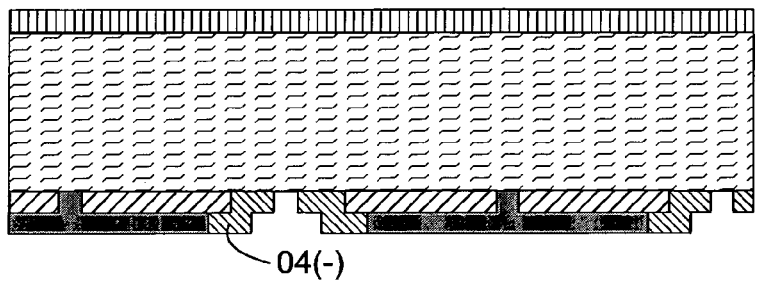
Figure 8G:
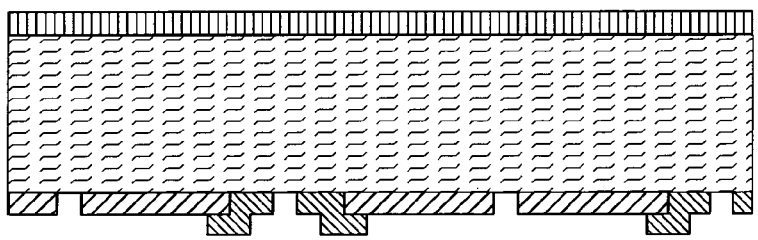
Figure 8H:
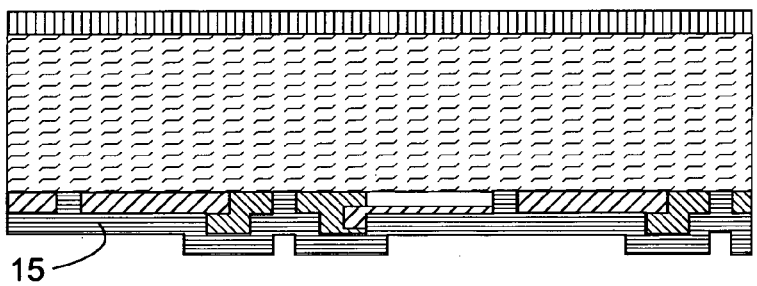
Figure 8:
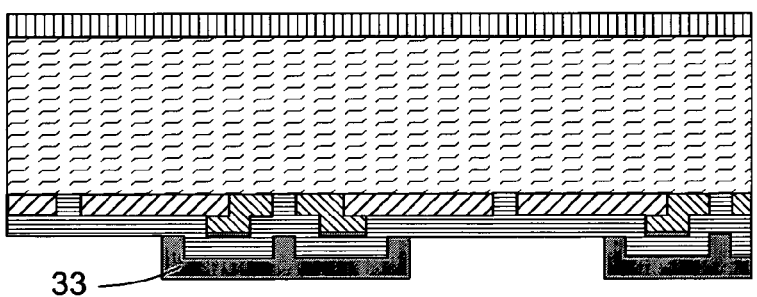
Figure 8J:
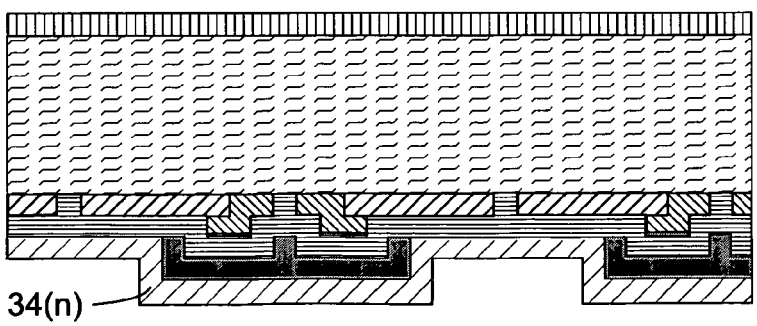
Figure 8K:
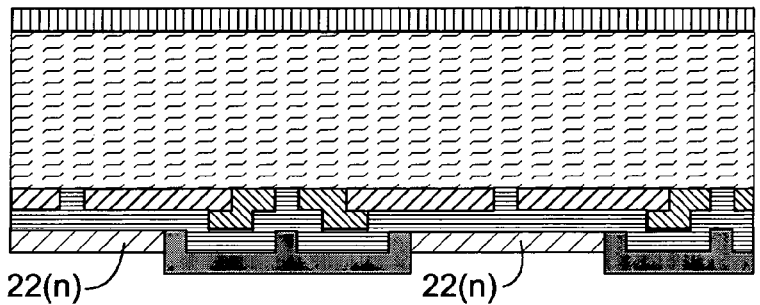
Figure 8L:
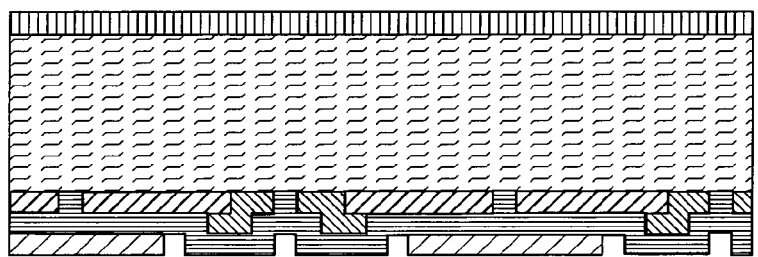
Figure 8M:
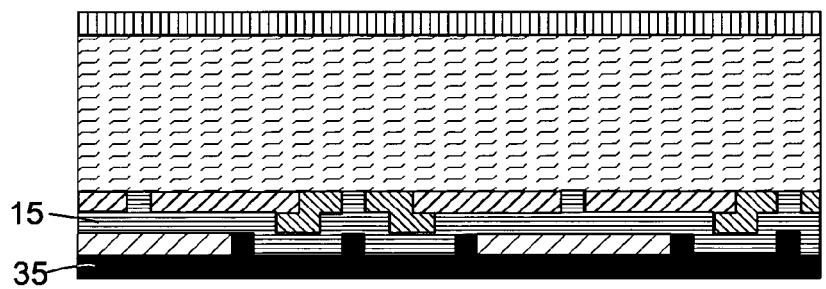
Figure 8N:
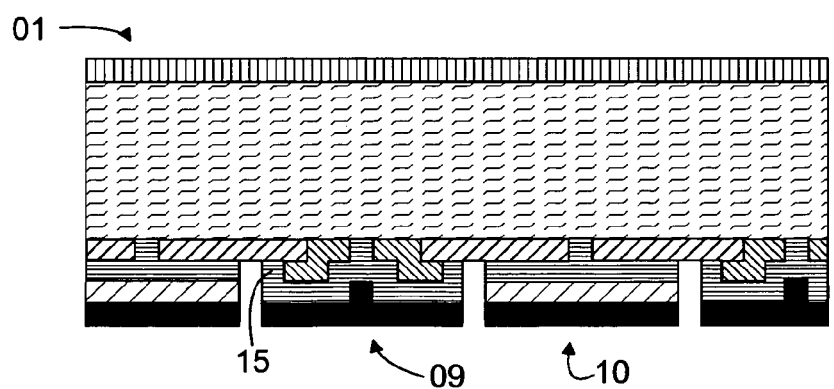

A suitable conventional production method is shown in FIGS. 8A to 8N with the example of the solar cell 01 according to FIG. 3D.

FIG. 8A—Provision of the absorber layer 20 (for example a silicon wafer, p-doped), texturing on the front (and possibly rear), front passivation of the absorber layer 20 by application of the planar passivation layer 14.

FIG. 8B—Deposition, over the entire rear surface, of an insulating passivation layer 30 with positive surface charge.

FIG. 8C—Structuring of the passivation layer 30 with positive surface charge to form the second passivation regions 05 with positive surface charge.

FIG. 8D—Application of a masking 31 on the second passivation regions 05.

FIG. 8E—Deposition, over the entire rear surface, of an insulating passivation layer 32 with negative surface charge.

FIG. 8F—Structuring of the passivation layer 32 with negative surface charge to form the first passivation regions 04 with negative surface charge.

FIG. 8G—Removal of the masking 31.

FIG. 8H—Deposition, over the entire rear surface, of the electrically conductive, intrinsic passivation layer 15 as an intrinsic hetero-contact layer.

FIG. 8I—Application of a masking 33 onto the electrically conductive, intrinsic passivation layer 15.

FIG. 8J—Deposition, over the entire rear surface, of an emitter layer 34 as a hetero-contact layer with opposite doping (in this case n-doped) compared to the absorber layer 20.

FIG. 8K—Structuring of the emitter layer 34 to form the emitter regions 22.

FIG. 8L—Removal of the masking 33.

FIG. 8M—Deposition, over the entire rear surface, of a contact layer 35.

FIG. 8N—Structuring over the entire surface of the contact layer 35 and on the conductive passivation layer 15 to generate the first contact elements 09 and the second contact elements 10.

In the case of large structure sizes, the structuring of the insulating passivation layers 30 and 32 may be achieved by inkjet methods or by laser structuring (structuring limit approximately 10 µm). This poses no problem in the case of wafer-based solar cells (typical structure sizes in the region of the wafer thickness, that is to say between 100 and 300 µm). In the case of smaller structure sizes, as are necessary in the case of thin-layer solar cells (typical structure sizes in the region of the absorber thickness, that is to say between 500 nm and 10 µm), the structuring may be achieved, for example, photolithographically (structuring limit of approximately 100 nm to currently approximately 40 nm). By way of example, the corresponding structuring is illustrated generally for formation of the second passivation regions 05 (instead of FIG. 8C).

Figure 9A:
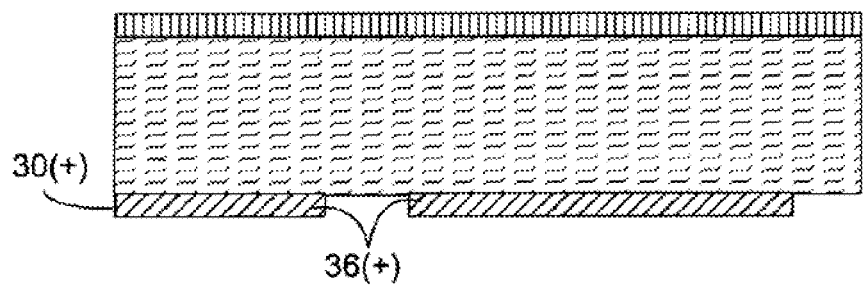
FIGS. 9A to D show a conventional production method with fine structuring of the passivation regions.

FIG. 9A—Rough structuring of the passivation layer 30 with positive surface charge to form rough passivation regions 36.

Figure 9B:
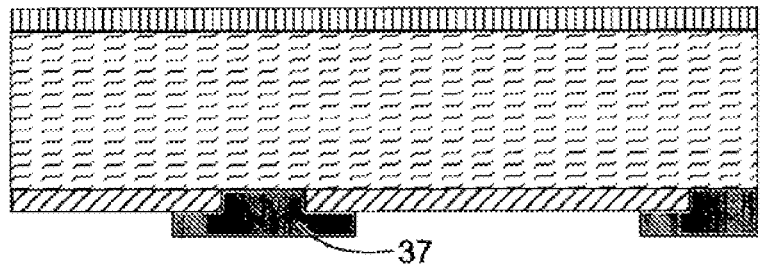

FIG. 9B—Application of a masking 37 to the rough passivation regions 36.

Figure 9C:
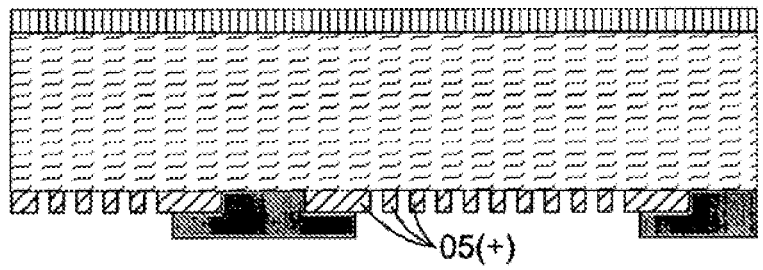

FIG. 9C—Fine structuring of the rough passivation regions 36 by photoresist and laser interference to form the passivation regions 05 with positive surface charge in fine structuring.

Figure 9D:
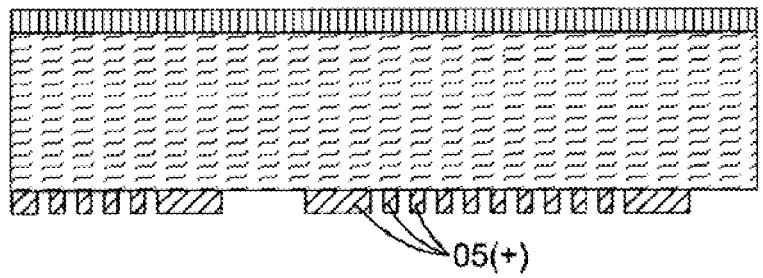

FIG. 9D—Removal of the masking 37.

The structuring of the contact openings 11, 12 can also take place either via inkjet methods or laser structuring (for contact openings with a diameter >10 µm), or by means of a preferred method for randomly forming nanocontacts, as will be described in greater detail hereinafter, since no alignment problems occur in the case of the invention. Nanoholes with a diameter of approximately 500 nm to 1 µm can be produced with the described method by etching a structured matrix, which consists for example of ZnO, with random distribution and used for the contact elements 09, 10.

Figure 10A:
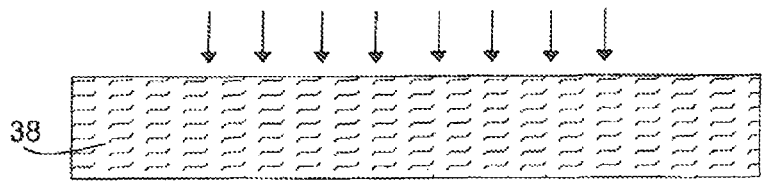
FIGS. 10A to M show a new production method of a solar cell according to FIG. 2A with fine structuring.

The preferred advantageous specific method according to an embodiment of the invention will be explained with the example of a solar cell 01 according to FIG. 3D having contact openings 11, 12 with nanoscale dimensions in a thin-layer structure on a superstrate 40:

FIG. 10A—Provision of a superstrate 38 (for example glass), the incident light during operation is indicated by arrows.

Figure 10B:
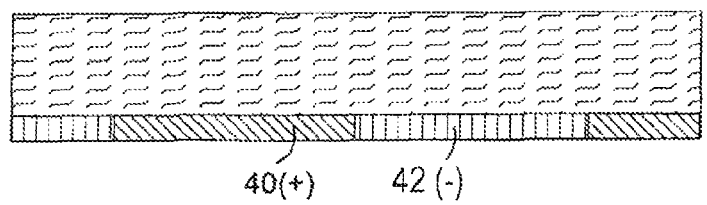

FIG. 10B—Deposition, over the entire surface, of the front planar passivation layer 14 (for example $SiO_2$, SiN, AlO). The passivation layer 14 has alternately arranged passivation faces 40, 42 of high surface charge of opposed polarity which are arranged opposite the passivation regions 04, 05. Excess charge carrier separation and transport are assisted by the correspondingly formed electric fields.

Figure 10C:
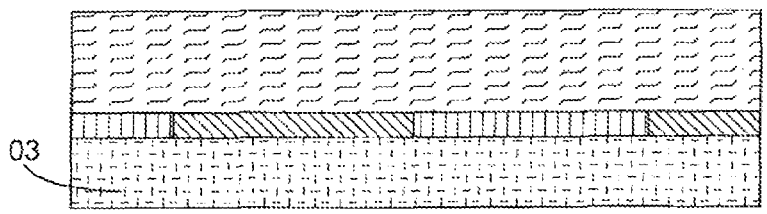

FIG. 10C—Deposition, over the entire surface, of the absorber layer 03 (for example a-Si:H(i)).

Figure 10D:
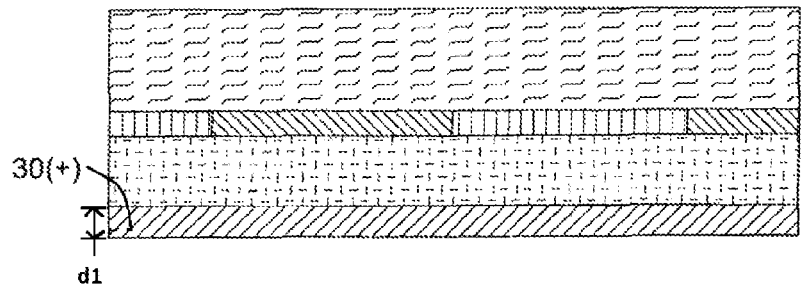

FIG. 10D—Deposition, over the entire surface, of the insulating passivation layer 30, in the example with high positive surface charge (for example SiN) with a selected layer thickness $d_1$ corresponding to the etching rate.

Figure 10E:
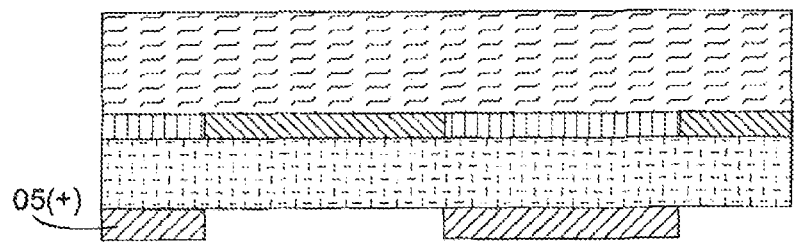

FIG. 10E—Regional structuring of the second insulating passivation layer 30 (without vias) to form the second passivation regions 05.

Figure 10F:
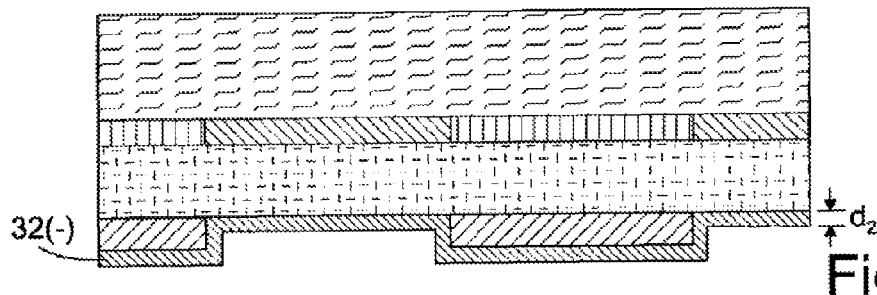

FIG. 10F—Deposition, over the entire surface, of the insulating passivation layer 32, in the example with high negative surface charge (for example AlO) with a selected layer thickness $d_2$ corresponding to the etching rate.

Figure 10G:
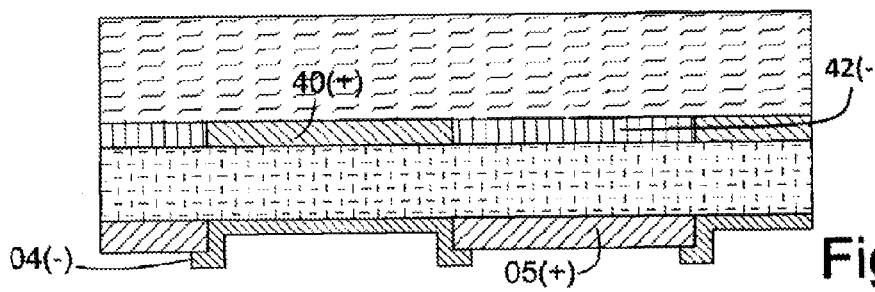

FIG. 10G—Regional structuring of the first insulating passivation layer 32 to form the first passivation regions 04.

Figure 10H:
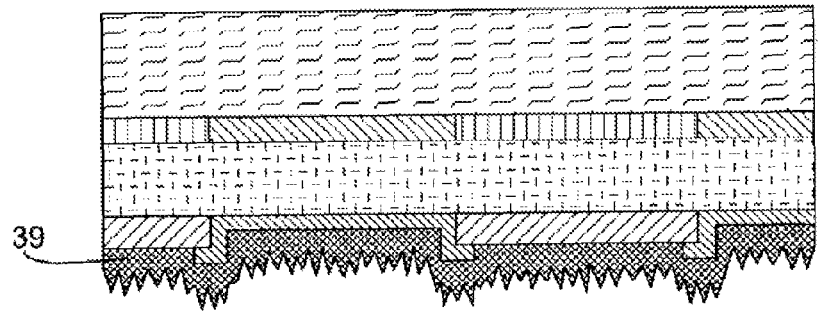

Generation of Randomly Distributed Nanocontact Openings:

FIG. 10H—Deposition, over the entire surface, of a matrix 39 (for example ZnO) and subsequent structuring of the matrix 39, for example by etching.

Figure 10I:
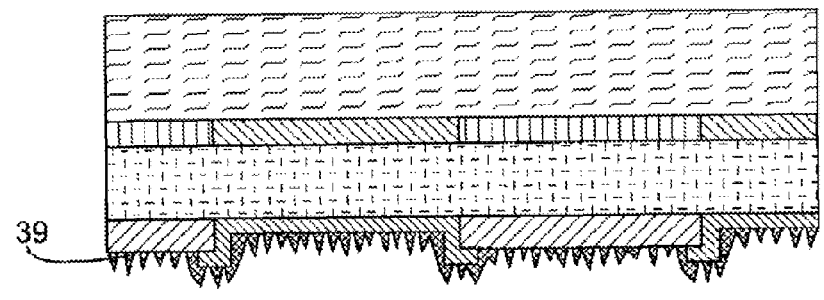

FIG. 10I—Partial etching off of the matrix 39 until it is removed completely randomly in parts.

Figure 10J:
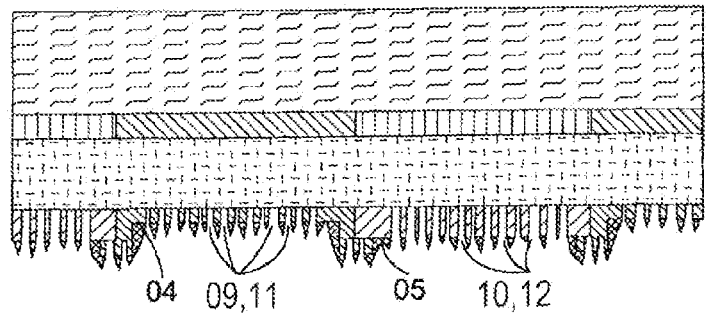

FIG. 10J—Selective etching (in the plasma) of the matrix 39. The etching does not corrode the matrix 39 owing to the material selection (for example zinc oxide), but does corrode the first and second passivation layers 30, 32 (for example SiN, AlO). Contact openings 11, 12 of nanoscale dimensions (diameter in the range of 500 nm to 2 µm) are thus produced in the first and second passivation regions 04, 05 (the layer thicknesses $d_1$, $d_2$ of the two passivation layers 30, 32 were selected accordingly) with suitably selected etching duration.

Figure 10K:
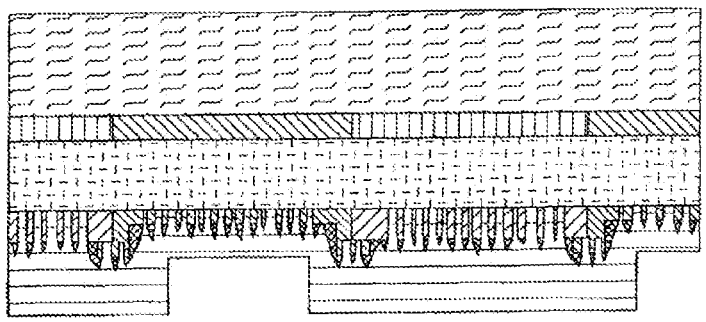

FIG. 10K—Deposition, over the entire surface, of the conductive, intrinsic passivation layer 15 (for example a-Si:H(i)).

Figure 10L:
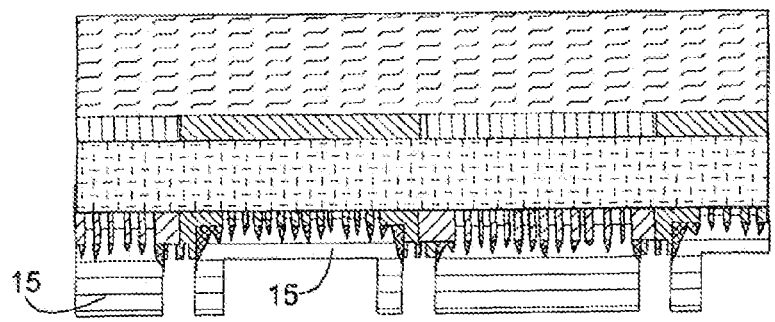

FIG. 10L—Insulation of the intrinsic passivation layer 15 on the first and second passivation regions 04, 05 by laser structuring.

Figure 10M:
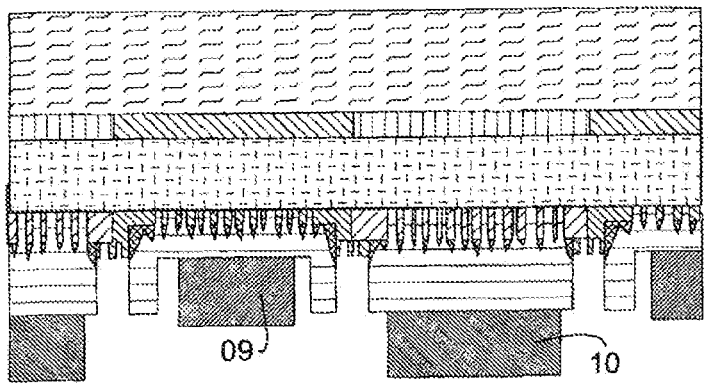

FIG. 10M—Deposition of the metal contact elements 09, 10 from two different metals with different work function according to the polarity of the excess charge carriers to be removed.

Suitable Materials and Parameters for the Solar Cell:

absorber layer—all absorber layers currently used for solar cells, for example intrinsic or p- or n-doped, hydrogenated, amorphous silicon, a-Si:H(i), a-Si:H(p), a-Si:H(n), intrinsic or p- or n-doped microcrystalline silicon, pc-Si(i), pc-Si(p), pc-Si(n), intrinsic or p- or n-doped polycrystalline silicon, polyc-Si(i), polyc-Si(p), polyc-Si(n), intrinsic or p- or n-doped crystalline silicon, c-Si(i), c-Si(p), c-Si(n), cadmium telluride, CdTe, copper indium selenide, CISe, copper indium gallium selenide, CIGSe, copper indium sulphide, CIS.

first passivation region—all insulating passivation layers with such high negative surface charge that degeneration occurs, or almost occurs on the absorber surface (in the case of wafer-based c-Si solar cells with an intrinsic absorber this corresponds approximately to a negative surface charge $>10^{11}$ $cm^{-2}$, in the case of wafer-based c-Si solar cells with a p-doped absorber (for example $Na=1.5\times10^{16}$ $cm^{-3}$) this corresponds approximately to a negative surface charge $>4\times10^{12}$ $cm^{-2}$). For example, such a material is aluminium oxide $Al_2O_3$ (surface charge approximately $1.3\times10^{13}$ $cm^{-2}$).

second passivation region—all electrically insulating passivation layers with such high positive surface charge that degeneration occurs, or almost occurs on the absorber surface (in the case of wafer-based c-Si solar cells with an intrinsic absorber this would correspond approximately to a positive surface charge $>10^{11}$ $cm^{-2}$ in the case of wafer-based c-Si solar cells with a p-doped absorber (for example $Na=1.5\times10^{16}$ $cm^{-3}$) this corresponds approximately to a positive surface charge $>2\times10^{12}$ $cm^{-2}$). For example, such a material is silicon nitride, $SiN_x$ (surface charge approximately $2\times10^{12}$ $cm^{-2}$).

third passivation region—all electrically insulating passivation layers without high surface charge, for example $SiO_2$.

planar passivation layer—$SiO_2$, $Al_2O_3$, $SiN_x$, a-Si:H(i).

conductive passivation layer—intrinsic hydrogenated, amorphous silicon a-Si:H(i).

emitter layer—doped oppositely to the absorber layer: p- or n-doped silicon, c-Si(p), c-Si(n), heterogeneously separated p- or n-doped hydrogenated, amorphous silicon, a-Si:H(p), a-Si:H(n), heterogeneously separated p- or n-doped microcrystalline silicon, pc-Si:H(p), pc-Si:H(n), heterogeneously separated cadmium sulphide, CdS, transparent conductive oxides (ZnO, ITO, n-doped).

BSF layer—highly doped identically to the absorber layer: p- or n-doped silicon, c-Si(p), c-Si(n), heterogeneously separated p- or n-doped hydrogenated, amorphous silicon, a-Si:H(p), a-Si:H(n), heterogeneously separated p- or n-doped microcrystalline silicon, pc-Si:H(p), pc-Si:H(n), transparent conductive oxides (ZnO, ITO, n-doped)

contact elements—metals, for example aluminium, molybdenum, chromium, silver, nickel, titanium, palladium or transparent conductive oxides (ZnO, ITO)

Thickness $L_x$ of the absorber layer—wafer-based c-Si solar cells: typically between 100 µm and 300 µm.

Thickness $L_x$ of the absorber layer—thin-layer solar cells: typically between 500 nm and 10 µm.

minimal diffusion length: $L_{eff,min} L_x$ mean distance $L_y$ between the contact openings: $\leq L_x$ Mean width W of the space-charge regions in the absorber, which width is produced by the insulating passivation regions—wafer-based c-Si solar cells: intrinsic absorber: 25 µm doped absorber (for example $Na=1.5\times10^{16}$ $cm^{-3}$): 300 nm.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS 01 solar cell
02 rear of 01
03 semiconductive absorber layer, intrinsic
04 electrically insulating, first passivation region with high surface charge of one polarity, for example negative
05 electrically insulating, second passivation region with high surface charge of opposed polarity, for example positive
06 space-charge region of 04
07 space-charge region of 05
08 electric field
09 first contact element for removing excess charge carriers of one polarity, for example positive
10 second contact element for removing excess charge carriers of opposed polarity, for example negative
11 first contact opening for 09 (point- or strip-like)
12 second contact opening for 10 (point- or strip-like)
13 front of 01
14 planar passivation layer on 13
15 electrically conductive intrinsic passivation layer on 02
16 contact strips for 09
17 contact strips for 10
18 busbar for 16, 09
19 busbar for 17, 10
20 semiconductive absorber layer (absorber), doped normally (p/n)
21 hetero-BSF layer (heterogeneous, doped normally identically to 20)
22 emitter layer (heterogeneous, doped normally oppositely to 20)
23 hetero-BSF layer (diffused, doped normally identically to 20)
24 emitter layer (locally diffused, highly doped oppositely to 20)
25 emitter layer (locally diffused, doped normally oppositely to 20)
26 planar passivation layer with high surface charge of one polarity, for example positive
27 feedthrough
28 pseudo-via
29 emitter layer (planarly diffused, doped normally oppositely to 20)
30 electrically insulating passivation layer over the entire surface with high surface charge of one polarity, for example positive
31 masking for 29
32 electrically insulating passivation layer over the entire surface with high surface charge of opposed polarity, for example negative
33 masking for 32
34 rear emitter layer (heterogeneous, doped normally oppositely to 20)
35 contact layer
36 rough passivation area (high positive or negative surface charge)
37 masking for 36
38 superstrate
39 matrix, plasma-etch-resistant
40 first passivation area of high surface charge of one polarity, for example positive (opposite 04)
42 second passivation area of high surface charge of opposed polarity, for example negative (opposite 05)
43 electrically insulating third passivation region without surface charge
$d_1$ layer thickness of 30
$d_2$ layer thickness of 32
$E_C$ energy level conduction band
$E_F$ Fermi level
$E_V$ energy level valence band
$L_{eff,min}$ effective diffusion length (minimal in minority carriers)
$L_x$ thickness of 03, 20
$L_y$ mean distance between 11, 12
W mean width of 06, 07

The invention claimed is:

1. A solar cell, comprising:

a photoactive, semiconductive absorber layer configured to generate excess charge carriers of opposed polarity by light incident on a front of the absorber layer during operation, the absorber layer being configured to separate and move, via at least one electric field formed in the absorber layer, the photogenerated excess charge carriers of opposed polarity over a minimal effective diffusion length $L_{eff,min}$ in the absorber layer, the absorber layer having a thickness $L_x$ of $0<L_x \leq L_{eff,min}$;

first contact elements configured to remove the excess charge carriers of a first polarity on a rear of the absorber layer which faces away from the light incident during operation;

second contact elements configured remove the excess charge carriers of a second opposing polarity on the rear of the absorber layer, a distance $L_y$ between each first and each second contact element being $0<L_y \leq 2 L_{eff,min}$;

at least one first passivation region disposed on the rear of the absorber layer, each of the at least one first passivation region including a first, undoped, electrically insulating, non-semiconductive material having a surface charge of the second opposing polarity and a first contact opening in the first non-semiconductive material configured for connection of a respective first contact element;

at least one second passivation region disposed in an alternating, neighboring arrangement with the at least one first passivation region on the rear of the absorber layer, each of the at least one second passivation region including a second, different, undoped, electrically insulating, non-semiconductive material having a surface charge of the first polarity and a second contact opening in the second non-semiconductive material configured for connection of a respective second contact element, wherein the first polarity of the at least one second passivation region and the second opposing polarity of the at least one first passivation region are configured to cause a band bending of the absorber layer in each of a first direction and a second opposing direction, forming an electric field between neighboring, differing, passivation regions of opposed surface charges where excess charge carriers are separated.

2. The solar cell according to claim 1, wherein the first and second contact elements have at least one of a point-like and a strip-like design.

3. The solar cell according to claim 2, wherein the first and second contact elements include two metals having different work functions based on the polarity of the excess charge carriers to be dissipated.

4. The solar cell according to claim 1, wherein the first and second contact openings are respectively disposed at least in a region of centroids of the first and second passivation regions.

5. The solar cell according to claim 1, wherein the first and second contact openings include a plurality of randomly distributed contact openings having nanoscale dimensions respectively disposed in the first and second passivation regions.

6. The solar cell according to claim 1, further comprising a planar passivation layer disposed on the front of the absorber layer.

7. The solar cell according to claim 6, wherein the planar passivation layer includes alternating electrically insulating first and second passivation areas having a high surface charge, the first and second passivation areas of the planar passivation layer respectively having an opposed polarity and an opposite arrangement to the first and second passivation regions disposed on the rear of the absorber layer.

8. The solar cell according to claim 1, further comprising at least one of a planar and a structured electrically conductive intrinsic passivation layer which contacts the absorber layer in a region of at least one of the first and the second contact openings disposed on at least one of the first and the second passivation regions.

9. The solar cell according to claim 8, wherein the absorber layer is doped and additional, oppositely doped emitter layers that are at least one of heterogeneously applied and diffused are disposed on the at least one of a planar and a structured electrically conductive intrinsic passivation layer.

10. The solar cell according to claim 8, wherein the absorber layer is doped and the at least one of a planar and a structured electrically conductive intrinsic passivation layer includes additional, identically doped, heterogeneously applied back surface field (BSF) layers that are diffused at least one of locally and over an entire surface of the at least one of a planar and a structured electrically conductive intrinsic passivation layer.

11. The solar cell according to claim 8, wherein the at least one of a planar and a structured electrically conductive intrinsic passivation layer includes intrinsic a-Si:H.

12. The solar cell according to claim 1, further comprising a narrow, thin, electrically insulating third passivation region without a high surface charge disposed between the first and the second passivation regions.

13. The solar cell according to claim 1, wherein the absorber layer is doped and at least one of the first and the second contact openings include additional, oppositely doped emitter layers that are at least one of heterogeneously applied and diffused, and which have a same surface charge as the doped absorber layer.

14. The solar cell according to claim 13, wherein the additional, oppositely doped emitter layers extend from the at least one of the first and the second contact openings to a respective one of the first and the second passivation regions without mutual contact with one another.

15. The solar cell according to claim 1, wherein the absorber layer is doped and at least one of the first and the second contact openings include additional, identically doped back surface field (BSF) layers that are at least one of heterogeneously applied, locally diffused and planarly diffused, and which have an opposite surface charge to the doped absorber layer.

16. The solar cell according to 15, wherein the additional, identically doped BSF layers extend from the at least one of the first and the second contact openings to a respective one of the first and the second passivation regions without mutual contact with one another.

17. The solar cell according to claim 1, wherein at least one of the first and the second contact openings include a feedthrough extending to the front of the absorber layer, a coating of the feedthrough and the absorber layer being of a same material as at least one of the first and the second passivation regions.

18. The solar cell according to claim 1, wherein the absorber layer includes at least one of intrinsic and doped silicon, the first and the second passivation regions respectively include aluminium oxide (AlO) with a high negative surface charge and silicon nitride (SiN) with a high positive surface charge, and the first and the second contact openings include at least one of a metal and a transparent conductive oxide (TCO).

19. A method for producing a solar cell including a plurality of randomly distributed contact openings, the method comprising:
providing a photoactive, semiconductive absorber layer of a solar cell;
depositing a first, electrically insulating passivation layer having a high surface charge of a first polarity with a layer thickness $d_1$ on the rear surface of the absorber layer so as to form second passivation regions at a rear of the absorber layer configured to remove charge carriers of a second, opposing polarity;
depositing a second, differing, electrically insulating passivation layer having a high surface charge of the second, opposing polarity with a layer thickness $d_2$ on the rear surface of the absorber layer so as to form first passivation regions at the rear surface of the absorber layer configured to remove charge carriers of the first polarity, wherein the first passivation regions and the second passivation regions are in an alternating, neighboring arrangement with each other;
depositing a matrix including a plasma-etch-resistant material over an entire surface of each of the first and the second passivation regions;
partially etching off the matrix so as to remove the matrix completely at randomly distributed points; and
selectively etching the solar cell using a plasma that corrodes the first and second passivation regions and does not corrode the matrix, wherein the layer thicknesses $d_1$, $d_2$ of the first and second passivation layers are selected based on respective etching rates of the first and second passivation layers, so as to form a plurality of randomly distributed contact openings extending to the absorber layer.

20. The method according to claim 19, wherein the matrix includes ZnO.

* * * * *